(12) United States Patent
Maeda

(10) Patent No.: US 6,231,673 B1
(45) Date of Patent: *May 15, 2001

(54) MANUFACTURING METHOD OF SEMICONDUCTOR WAFER, SEMICONDUCTOR MANUFACTURING APPARATUS, AND SEMICONDUCTOR DEVICE

(75) Inventor: Shigenobu Maeda, Tokyo (JP)

(73) Assignee: Mitsubishi Denki Kabushiki Kaisha, Tokyo (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/349,514

(22) Filed: Jul. 9, 1999

(30) Foreign Application Priority Data

Jan. 22, 1999 (JP) .................................................. 11-014303

(51) Int. Cl.⁷ .................................................. C23C 16/00
(52) U.S. Cl. ............................. 118/718; 438/484; 118/729
(58) Field of Search ..................................... 118/715, 716, 118/718, 720, 721, 723 R, 729; 156/345; 204/298.23, 298.25, 298.26, 298.35

(56) References Cited

U.S. PATENT DOCUMENTS 5,439,524 * 8/1995 Cain et al. ..................... 118/723 E
5,505,779 * 4/1996 Mizuno et al. ...................... 118/719
5,863,338 * 1/1999 Yamada et al. ...................... 118/719

FOREIGN PATENT DOCUMENTS

| 61-177709 | 8/1986 | (JP) . |
| 2-196413 | 8/1990 | (JP) . |
| 5-19487 | 1/1993 | (JP) . |

OTHER PUBLICATIONS

Wolf, S. and Tauber, R. N., Silicon Processing for the VLSI ERA, vol. 1: Process Technology, publisher: Lattice Press, Sunset Beach, California, 1986.*

* cited by examiner

Primary Examiner—Gregory Mills
Assistant Examiner—Parviz Hassanzadeh
(74) Attorney, Agent, or Firm—Oblon, Spivak, McClelland, Maier & Neustadt, P.C.

(57) ABSTRACT

A carrier portion (15) carriers a strip wafer (S) longitudinally in a carrying direction (16). A processing portion (17) applies local processing such as plasma etching, thermal oxidation, CVD processing, and exposure to a partial processing region (18) of the main surface of the strip wafer (S). Uniformity in processing only has to be secured in the limited processing region (18). Since the processing region (18) moves on the strip wafer (S) when the strip wafer (S) is carried, the entire main surface of the strip wafer (S) is uniformly processed with ease. The length (L) of the strip wafer (S) is variable according to the expansion or reduction in the volume of production without any modification in the processing portion (17). Thus, expansion or reduction in the volume of production of semiconductor devices of the same kind can be met at a low cost.

39 Claims, 36 Drawing Sheets

MANUFACTURING METHOD OF SEMICONDUCTOR WAFER, SEMICONDUCTOR MANUFACTURING APPARATUS, AND SEMICONDUCTOR DEVICE

BACKGROUND OF THE INVENTION

1. Field of the Invention

The present invention relates to a manufacturing method of a semiconductor wafer, a semiconductor manufacturing apparatus, and a semiconductor device. It especially relates to improvements in adaptability to the expansion or reduction of the scale of production at a low cost.

2. Description of the Background Art

A semiconductor wafer conventionally used in the semiconductor process is a circular wafer S0 having a generally round plane form as shown in FIG. 41. In the circular wafer S0, a matrix of many rectangular semiconductor chips are formed in a chip region 150. As one of means for saving the cost of manufacturing a semiconductor, the diameter of the circular wafer S0 is being increased as shown in FIG. 41. This is based on a simple hypothesis that whether the circular wafer S0 has a large diameter or not makes little difference in the cost of processing a single circular wafer S0.

The circular wafer S0 is, as shown in FIG. 42, obtained by first forming a generally cylindrical semiconductor ingot 152 and then slicing it along planes perpendicular to the central axis. To increase the diameter of the circular wafer S0, therefore, the diameter of the semiconductor ingot 152 must be increased. Increasing the diameter of the single crystalline semiconductor ingot 152 is, however, not a ready technique so that a new developing cost is required.

In addition, with the increase in the diameter of the circular wafer S0, a semiconductor manufacturing apparatus 155 for manufacturing a semiconductor device using the circular wafer S0 must be modified to the apparatus 156 suitable for a larger-diameter circular wafer S0, as shown in FIG. 43. Such modification of the semiconductor manufacturing apparatus needs to be made through the entire semiconductor manufacturing process.

Especially, to uniformly process a circular wafer S0 having a larger surface area, it is necessary to improve uniformity in density of plasma or reaction gas, which requires developments of new technologies. As a result, new introduction of a more expensive semiconductor manufacturing apparatus, i.e., larger scale of capital investments, is required.

That is, the processing cost of a single circular wafer S0 is not the same as hypothesized but tends to rise with the increase in diameter. This results in enormous costs required for the capital investments with the increase in diameter, which cannot be covered only by a semiconductor maker.

As the number of semiconductor chips per circular wafer S0 increases with the increase in diameter, the number of semiconductor devices supplied for markets increases. If expansion of a semiconductor chip market fails to measure up to projections, the price of a semiconductor chip will fall due to a balance between supply and demand. Consequently, it could happen that the capital investments made for the increase in the diameter of the circular wafer S0 cannot be recovered. That is, the increase in diameter is attended with risk.

Moreover, recent development of the semiconductor manufacturing technique allows integration of an enormous number of circuit elements into a single semiconductor chip, which had been unthinkable before. This is followed by a move afoot to form a highly integrated circuit by combining various circuit components (referred to as "micro cells" or "IP (Intellectual Property)"), each composed of a plurality of circuit elements and performing a certain function.

A principal purpose of the conventional semiconductor device manufacturing technique is mass production of only a few kinds. A new "IP" age wherein an integrated circuit is formed of IPs, however, requires either flexible manufacturing system or mass production of multi kinds. In this "IP" age, even a DRAM which itself is a large scale integrated circuit is handled as a single IP. Conventional increase in the diameter of the circular wafer S0 to make a profit has been made on the understanding of the mass production of only a few kinds, but if things continue to be the way they are under the new condition of the flexible manufacturing system, it is not easy to ensure profits.

SUMMARY OF THE INVENTION

A first aspect of the present invention is directed to a manufacturing method of a semiconductor wafer comprising the steps of: (a) forming a generally columnar semiconductor ingot; and (b) slicing the semiconductor ingot along cut surfaces parallel to the central axis thereby to obtain a plurality of strip semiconductor wafers.

Preferably, the step (b) includes the step of: (b-1) removing part of longitudinal end portions of each object obtained by slicing the semiconductor ingot.

Alternatively, the step (b) includes the steps of: (b-1) cutting out a prismatic member from the semiconductor ingot, a central axis of the prismatic member corresponding to that of the semiconductor ingot; and (b-2) slicing the prismatic member along cut surfaces parallel to a side surface of the prismatic member thereby to form the plurality of strip semiconductor wafers into identical shape.

Alternatively, the step (b) includes the steps of: (b-1) slicing the semiconductor ingot along cut surfaces parallel to a central axis thereby to obtain a plurality of plate members; and (b-2) removing longitudinal and lateral end portions of the plurality of plate members thereby to form the plurality of strip semiconductor wafers into identical shape.

A second aspect of the present invention is directed to a semiconductor manufacturing apparatus comprising: a carrier portion for carrying a strip semiconductor wafer in its longitudinal direction; and a processing portion for selectively processing a partial region of a main surface of the semiconductor wafer along the longitudinal direction.

According to a third aspect of the present invention, the semiconductor manufacturing apparatus of the second aspect further comprises: a vacuum vessel defining a vacuum chamber in an inside thereof, wherein the carrier portion is placed in the vacuum chamber, and the processing portion defines a processing chamber opposed to the partial region in communication with the vacuum chamber.

According to a fourth aspect of the present invention, in the semiconductor manufacturing apparatus of the second or third aspect, the processing portion is divided into a plurality of unit processing portions for selectively performing different kinds of processing in different positions on a partial region of the main surface of the semiconductor wafer along the longitudinal direction; and the carrier portion carries the semiconductor wafer to pass it through the plurality of unit processing portions in sequence.

A fifth aspect of the present invention is directed to a semiconductor manufacturing apparatus comprising: a supporting member for supporting a strip semiconductor wafer so that one longitudinally extending edge of the semiconductor wafer is opposed to a horizontal rotation axis; a rotatory driving portion for rotatably driving the supporting member around the rotation axis; and a coating fluid dropping portion for dropping coating fluid on the semiconductor wafer along the edge.

A sixth aspect of the present invention is directed to a semiconductor manufacturing apparatus comprising: a cylinder capable of accommodating a strip semiconductor wafer with a longitudinal direction thereof parallel to the central axis of the cylinder; a heating portion for heating the semiconductor wafer which is accommodated in the cylinder; and a gas circulating portion for circulating gas from one end to the other in a direction of the central axis in the cylinder.

According to a seventh aspect of the present invention, in the semiconductor manufacturing apparatus of the sixth aspect, the central axis is horizontal. The semiconductor manufacturing apparatus further comprises: a supporting member for, while supporting the semiconductor wafer vertically, accommodating the semiconductor wafer in the cylinder.

According to an eighth aspect of the present invention, the semiconductor manufacturing apparatus of the sixth aspect further comprises: a supporting member for, while supporting a plurality of unit strip semiconductor wafers as the semiconductor wafer in parallel with each other at regular intervals, accommodating them with longitudinal directions thereof parallel to the central axis of the cylinder.

A ninth aspect of the present invention is directed to a semiconductor manufacturing apparatus comprising: a connection information extraction portion for extracting data representing connecting wires connected to a plurality of circuit elements, from a circuit diagram of circuitry to be integrated into a semiconductor chip, the circuitry being composed of a combination of the plurality of circuit elements; a storage portion for storing data representing layout patterns of a group of circuit elements; a synthesizing portion for reading out data representing layout patterns of the plurality of circuit elements from the storage portion and obtaining the data extracted by the connection information extraction portion, to generate data representing a layout pattern of the circuitry; and a drawing portion for drawing the layout pattern of the circuitry on the semiconductor chip on the basis of the data generated by the synthesizing portion. The drawing portion includes a particle beam drawing portion for drawing by scanning a particle beam.

According to a tenth aspect of the present invention, the semiconductor manufacturing apparatus of the ninth aspect further comprises: a mask pattern generating portion for generating mask patterns of the plurality of circuit elements by reading out the data representing layout patterns of the plurality of circuit elements from the storage portion, wherein the drawing portion further includes a mask pattern transfer portion for transferring the mask patterns of the plurality of circuit elements to the semiconductor chip; and the particle beam drawing portion draws layout patterns of the connecting wires.

According to an eleventh aspect of the present invention, in the semiconductor manufacturing apparatus of the tenth aspect, the mask pattern generating portion patterns a first mark for alignment accompanied with each one of the mask patterns of the plurality of circuit elements, the particle beam drawing portion draws a second mark in a position of the semiconductor chip where the first mark is to be superposed; and the mask pattern transfer portion aligns each one of the mask patterns of the plurality of circuit elements so that the first mark patterned around each one of the mask patterns of the plurality of circuit elements is superposed on the second mark drawn on the semiconductor chip.

A twelfth aspect of the present invention is directed to a semiconductor device comprising a semiconductor chip obtained from a semiconductor wafer which is manufactured by the manufacturing method of the first aspect.

A thirteenth aspect of the present invention is directed to a semiconductor device manufactured by either of the semiconductor manufacturing apparatuses of the fifth through eleventh aspects.

In the manufacturing method of the first aspect, strip semiconductor wafers are obtained by slicing a generally columnar semiconductor ingot along the cut surfaces parallel to the central axis, which is disclosed in neither Japanese Patent Laid-open No. 61-177709 nor 2-196413. This method increases efficiency in productivity of strip semiconductor wafers. The semiconductor ingot can be formed by a conventional well-known method. Besides, long pulling of the semiconductor ingot increases the longitudinal length and area of the semiconductor wafers at a low cost without losing uniformity in crystal structure.

In addition, this method can be adapted to any scale of production only by varying the longitudinal length of the semiconductor wafer while keeping the width thereof constant. It requires no further investments on production facilities for semiconductor devices.

In the manufacturing apparatus of the second aspect, unlike the techniques disclosed in Japanese Patent Laid-open No. 5-19487, the processing portion only has to secure processing uniformity in the processing region which is a partial region of the strip semiconductor wafer along the longitudinal direction. Since the processing region is continuously moved along the longitudinal direction of the semiconductor wafer by the carrier portion, it is easy to improve uniformity in processing across the semiconductor wafer. Further, the carrying and processing of the semiconductor wafer are performed in parallel with great efficiency.

Also, the processing portion performs local processing on the processing region. Thus, even if the lengths of the semiconductor wafers vary, equal processing is performed without any modification. That is, this apparatus can be adapted to expansion or reduction in the scale of production at a low cost with flexibility.

In the manufacturing apparatus of the third aspect, the processing chamber which is in communication with the vacuum chamber and opposed to the processing region is formed in the processing portion. This makes it possible to carry out processing such as CVD processing, plasma etching, and ion implantation, in a vacuum.

In the manufacturing apparatus of the fourth aspect, since the semiconductor wafer is carried to sequentially pass through the plurality of processing portions where various processing is performed, plural kinds of processing are performed with great efficiency. This apparatus further reduces a floor space required for the manufacturing line.

In the manufacturing apparatus of the fifth aspect, the strip semiconductor wafer is rotatably driven with its one longitudinally extending edge supported to be opposed to the rotation axis, and the coating fluid is dropped on that edge. The coating fluid is uniformly applied to the entire main surface of the semiconductor wafer by centrifugal forces. That is, like a spin coater for the conventional circular wafer, this apparatus achieves uniform application of the coating fluid to the strip semiconductor wafer.

In the manufacturing apparatus of the sixth aspect, the strip semiconductor wafer is accommodated longitudinally along the central axis in the cylinder, so that it does not prevent the gas stream flowing from one end to the other in the direction of the central axis. This improves uniformity in processing.

In the manufacturing apparatus of the seventh aspect, the horizontal central axis of the cylinder makes it easy to bring in/out the semiconductor wafer. Besides, since the semiconductor wafer is accommodated in an upright position, distortion of the semiconductor wafer due to heating can be suppressed.

In the manufacturing apparatus of the eighth aspect, a plurality of semiconductor wafers are accommodated in parallel with each other at regular intervals along the central axis in the cylinder. This improves processing efficiency without preventing the gas stream.

In the manufacturing apparatus of the ninth aspect, first, the layout information on the plurality of circuit elements which are to be integrated into the semiconductor chip is read out from the data representing the layout patterns of a group of circuit elements, i.e., the layout information. This information is synthesized with the layout information on the connecting wires, whereby the layout information on circuitry is obtained. Then, on the basis of the obtained layout information, the layout pattern of the circuitry is drawn on the semiconductor chip. This allows effective utilization of the existing layout information on various circuit elements which is semiconductor maker's expertise and thereby enables the drawing of a layout pattern of complex circuitry composed of those elements. Besides, the particle beam drawing portion uses no mask pattern for the drawing of the whole or part of the circuitry. Accordingly, this apparatus is adaptable for the flexible manufacturing system at a low cost.

In the manufacturing apparatus of the tenth aspect, mask patterns are used for the group of circuit elements whose layout information has already been stored and which have predetermined layout patterns. This compensates for low throughput of the particle beam drawing portion and makes the apparatus adaptable for the flexible manufacturing system at a low cost.

In the manufacturing apparatus of the eleventh aspect, a mark is patterned around each one of the mask patterns of the plurality of circuit elements which constitute circuitry to be integrated into a semiconductor chip, and another mark is drawn in a position of the semiconductor chip where the patterned mark is to be superposed. The mask patterns are then aligned using those marks as alignment marks. This facilitates high-precision alignment.

The semiconductor device of the twelfth aspect comprises the semiconductor chip obtained from the semiconductor wafer which is manufactured by the manufacturing method of the first aspect. This device is widely adaptable for various volumes of production at a low cost in response to the market demand or at the user's request.

The semiconductor device of the thirteenth aspect is manufactured by either of the manufacturing apparatus of the second through eleventh aspects. This device is widely adaptable for various volumes of production at a low cost in response to the market demand or at the user's request.

An object of the present invention is thus to resolve the aforementioned conventional problems and provide a manufacturing method of a semiconductor wafer, a semiconductor manufacturing apparatus, and a semiconductor device, which can be adapted to the expansion or reduction of the scale of production of semiconductor devices of the same kind with flexibility at a low cost.

Techniques relating to the manufacturing method of a semiconductor wafer according to the present invention are disclosed, for example, in Japanese Patent Laid-open Nos. 61-177709A and 2-196413A; and techniques relating to the semiconductor manufacturing apparatus according to the present invention for example in Japanese Patent Laid-open No. 5-19487A.

These and other objects, features, aspects and advantages of the present invention will become more apparent from the following detailed description of the present invention when taken in conjunction with the accompanying drawings.

DESCRIPTION OF THE PREFERRED EMBODIMENTS

First Preferred Embodiment

Figure 1:
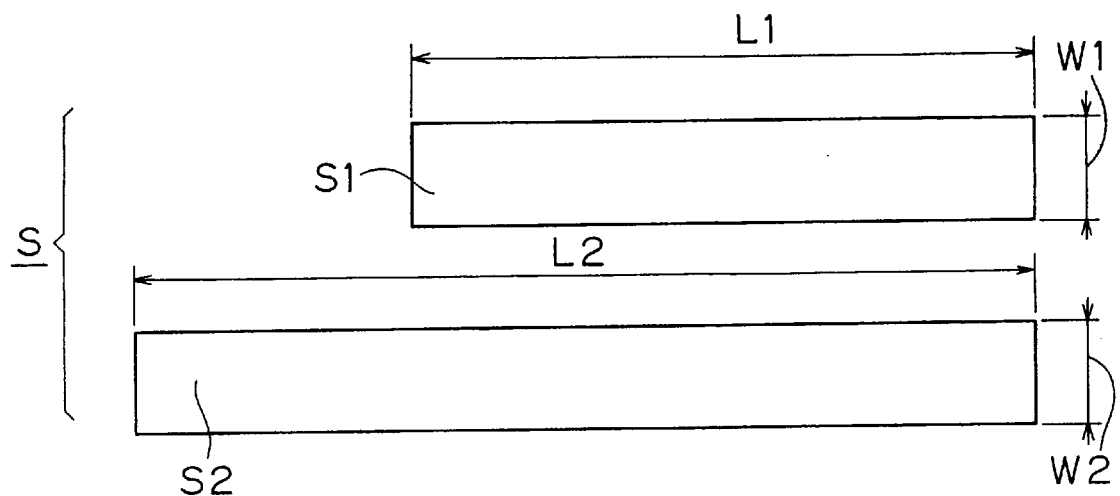
FIG. 1 is a plan view of a semiconductor wafer obtained by a method according to a first preferred embodiment.

FIG. 1 is a plan view showing a plane form of a semiconductor wafer manufactured by a manufacturing method of a semiconductor wafer according to a first preferred embodiment. As shown in FIG. 1, in the manufacturing method of the first preferred embodiment, the semiconductor wafer is manufactured as a strip wafer S extending in one direction, preferably in a generally rectangular plane shape.

Two strip wafers S1, S2 of FIG. 1 provide an example that longitudinal lengths L1, L2 vary according to the volume of production of semiconductor chips of the same kind. Lateral widths W1, W2 are, on the other hand, fixed to a certain value matching the breadth of an apparatus used to process the strip wafers S. For instance, the widths W1, W2 are set at 3 cm and the lengths L1, L2 at 50 cm or more.

Figure 2:
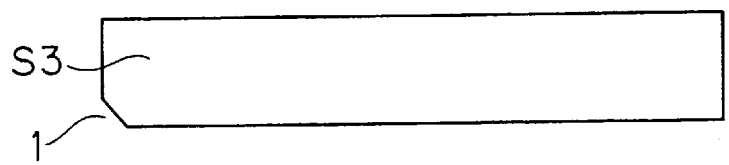
FIG. 2 is a plan view showing a modification of the semiconductor wafer of FIG. 1.
Figure 3:
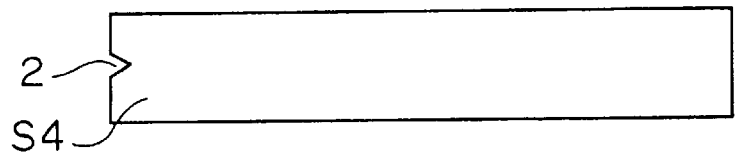
FIG. 3 is a plan view showing another modification of the semiconductor wafer of FIG. 1.
Figure 4:
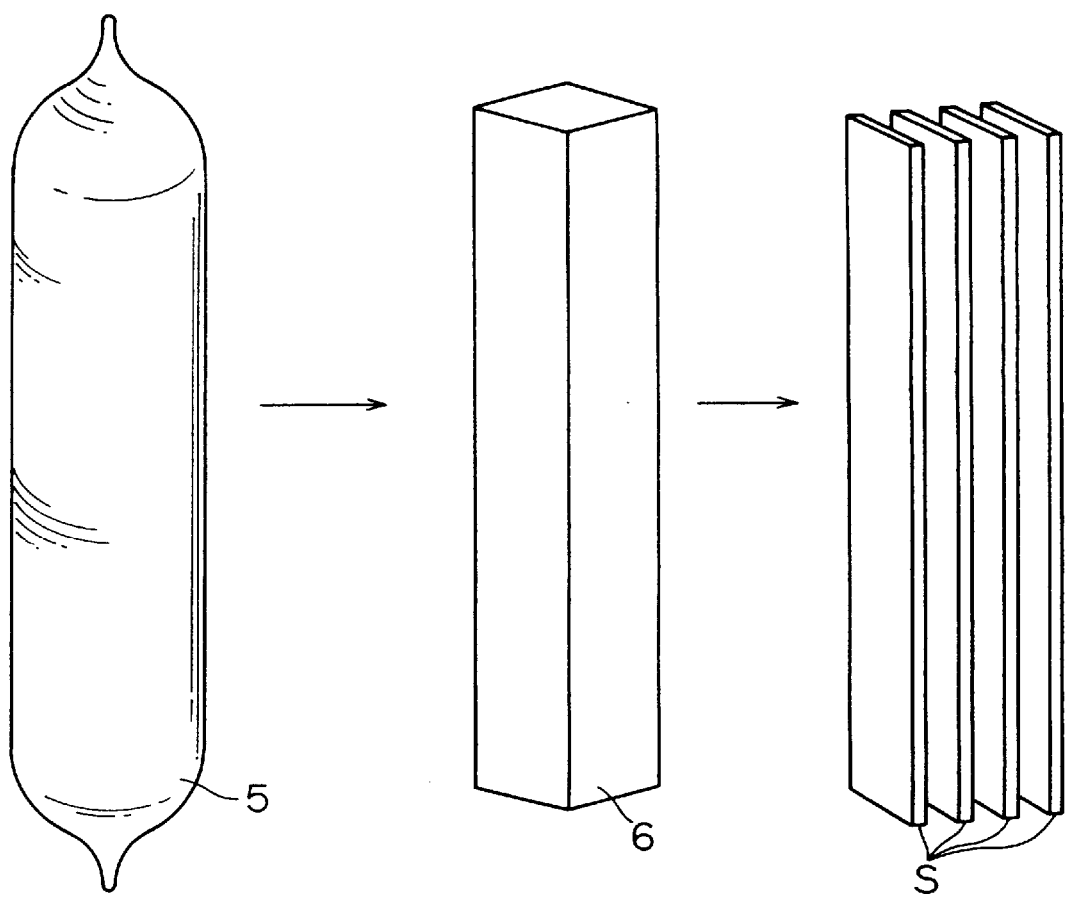
FIG. 4 is a process drawing showing an example of the method of the first preferred embodiment.

Corresponding to a notch or an orientation flat in the conventional circular wafer, notches 1 and 2 may be provided in part of strip wafers S3 and S4, respectively, as shown in FIGS. 3 and 4. Those notches 1 and 2 are provided in such positions that respective longitudinal leading edges of the strip wafers S3 and S4 become distinguishable as shown in FIG. 2 and 3.

Figure 5:
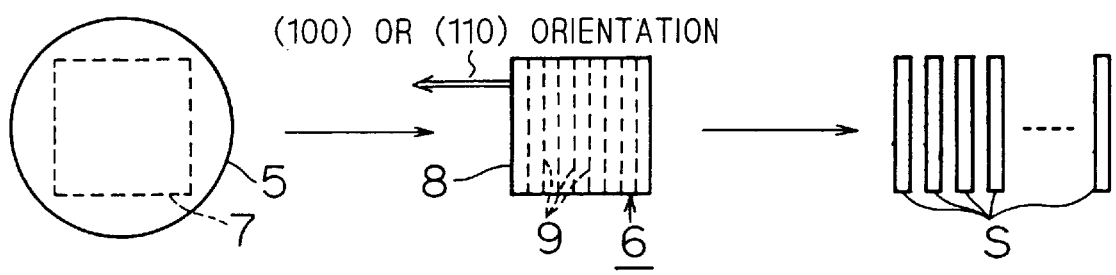
FIG. 5 is a top view of FIG. 4.

FIGS. 4 and 5 are process drawings showing an example of a manufacturing method of the strip wafers S. FIG. 4 is a perspective view and FIG. 5 is a top view of the strip wafers S. In the manufacture of the strip wafers S, first, a generally columnar semiconductor ingot 5 is formed, for example, by Czochralski method. This is a well-known step which is used also in the manufacture of the circular wafer S0.

Then, unlike the conventional method, a prism having the same central axis as the semiconductor ingot 5 is cut out from the semiconductor ingot 5 along a cut surface 7, whereby a prismatic member 6 is obtained. The prismatic member 6 is then sliced along slice surfaces (cut surfaces) 9 parallel to one side surface of the prismatic member 6, whereby a number (generally a plurality) of strip wafers S are obtained. The orientation of the cut surfaces 7 and 9 is set so that a main surface 8 of the strip wafers S is, for example, in a (100) or (110) orientation.

In this fashion, a specific crystalline plane such as a (100) surface can be selected as a main surface of the strip wafer S as that of the conventional circular wafer S0. Thus, as is the case with the conventional circular wafer S0, an epitaxial growth layer can be formed on the main surface. This allows reduction or elimination of the influence of crystal defects such as COP (Crystal Originated Particle). Also, the influence can be eliminated even if the crystal structure along the longitudinal direction lacks uniformity.

Figure 6:
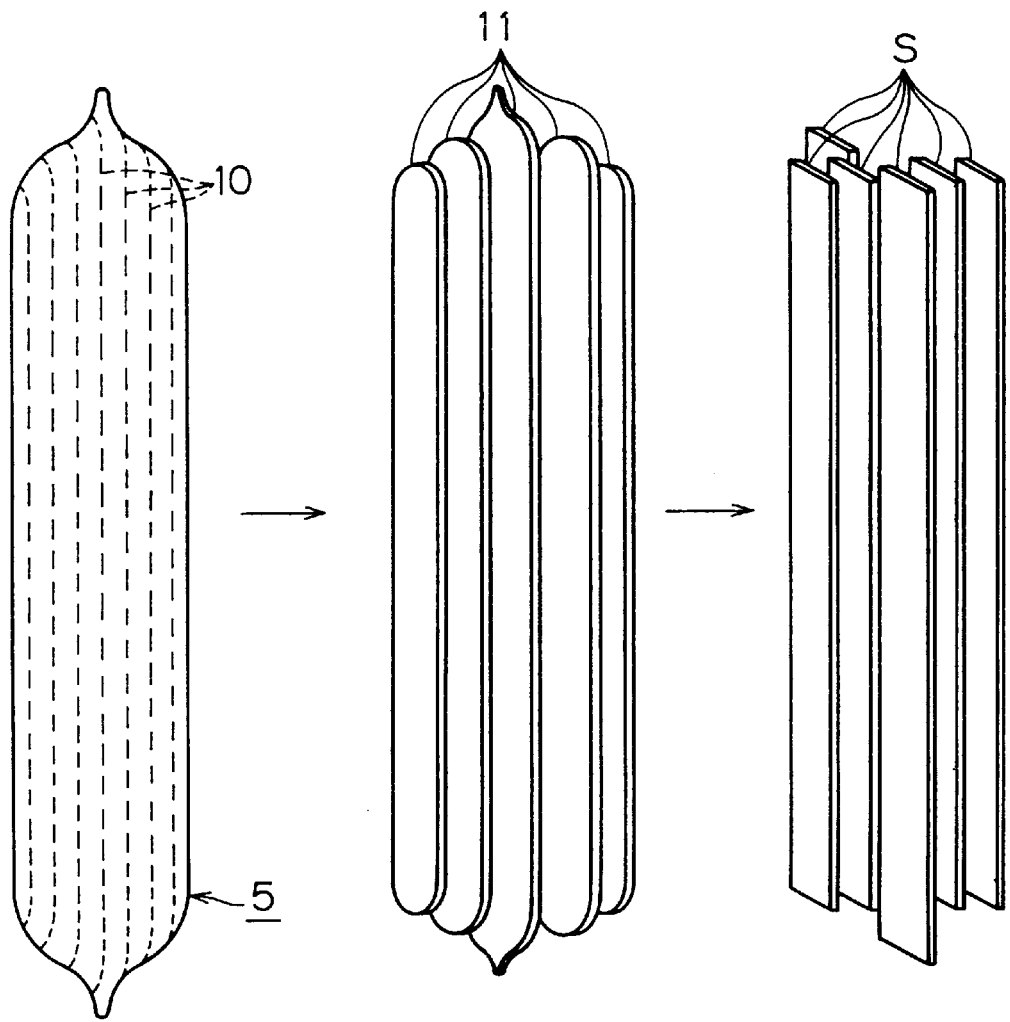
FIG. 6 is a process drawing showing another example of the method of the first preferred embodiment.
Figure 7:
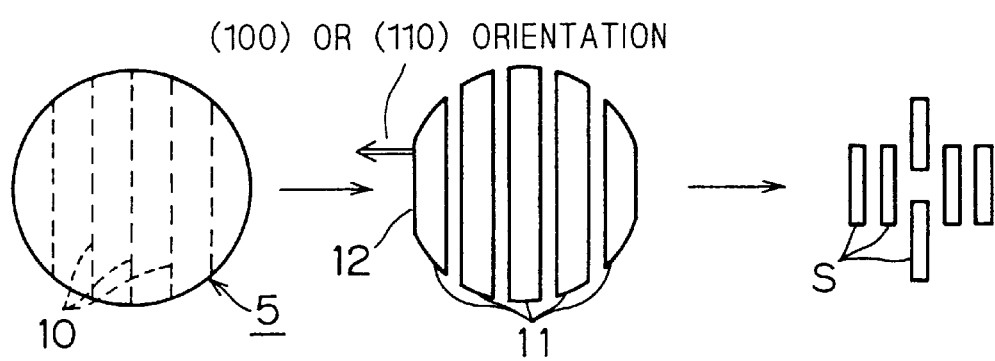
FIG. 7 is a top view of FIG. 6.

FIGS. 6 and 7 are process drawings showing another example of the manufacturing method of the strip wafers S. FIG. 6 is a perspective view and FIG. 7 is a top view of the strip wafers S. In this method, instead of cutting out the prismatic member 6 from the semiconductor ingot 5, the semiconductor ingot 5 is sliced along a plurality of cut surfaces 10 parallel to the central axis of the semiconductor ingot 5, whereby a number (generally a plurality) of plate members 11 are obtained. The orientation of the cut surfaces 10 are set so that main surfaces 12 of the plate members 11 are, for example, in a (100) or (110) orientation.

The plurality of plate members 11 have various widths and round plane shape at their longitudinal end portions. Their longitudinal lengths are also irregular. As shown in FIG. 7, each cross-sectional shape of the plurality of plate members 11 is not rectangular so that each plate member 11 has a pair of main surfaces (front and rear surfaces) of different widths. In the subsequent step, therefore, the plurality of plate members 11 are further cut to obtain a plurality of strip wafers S each having the same width W and the same length L. By this cutting, the cross-sectional shape of the strip wafers S becomes rectangular.

As previously described, the area of the strip wafer S can be varied by changing the length L while keeping the width W constant. To change the length L, the axial length of the semiconductor ingot 5 needs to be changed. The length of the semiconductor ingot 5 is determined by a pulling length of the semiconductor ingot 5. Although it is not easy to increase the diameter of the semiconductor ingot 5 while maintaining crystal uniformity, changing the pulling length is not so difficult. As to the semiconductor ingot for 6 or less inch of small-diameter wafer, crystal uniformity over a length of several meters has already been secured.

Therefore, the area of the strip wafer S can be extended at a low cost by increasing the length L At this time, since the width W is kept constant, there is no need to replace the apparatus to process the strip wafer S. That is, no new investment is required for the production facilities of the semiconductor devices. In this respect, this method is adaptable to the expansion of the scale of production at a low cost.

This method can also be adapted to the flexible manufacturing system required in the IP age, by reducing the area to shorten the length L. In this case, also, the width W is constant, so that no further investment is required for the production facilities. In this fashion, the strip wafer S manufactured by either method shown in FIGS. 4 through 7 has the advantage of being adaptable to the expansion or reduction of the scale of semiconductor chip production at a low cost, in response to the market demand for the semiconductor chips of the same kind. That is, it has the advantage of excellent production scalability.

Second Preferred Embodiment

Figure 8:
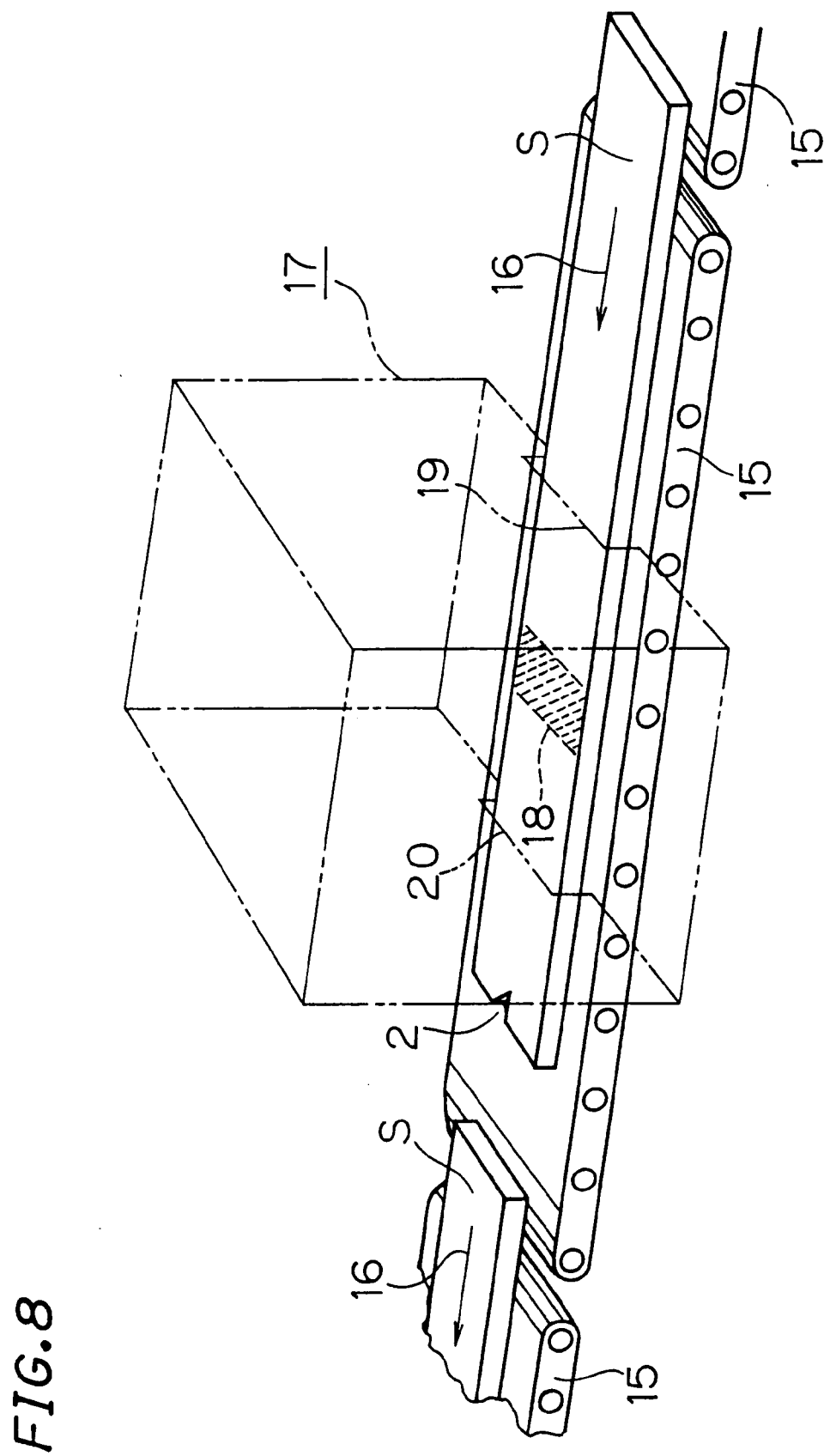
FIG. 8 is a perspective view of an apparatus according to a second preferred embodiment.

FIG. 8 is a perspective view showing an example of a semiconductor manufacturing apparatus for manufacturing a semiconductor device using the strip wafer S which is manufactured by the manufacturing method of a semiconductor wafer according to the first preferred embodiment. The manufacturing apparatus comprises a carrier portion 15 and a processing portion 17. The carrier portion 15 carries the strip wafer S in a carrying direction 16 along the longitudinal direction to move it from a carrier entrance 19 to a carrier exit 20 provided in the processing portion 17. The processing portion 17 selectively processes a processing region 18 corresponding to a partial region along a longitudinal direction of the strip wafer S passing therethrough.

The processing portion 17 performs processing such as etching, transfer of mask patterns, and heat treatment, and various other processing in the semiconductor process. The carrier entrance 19 and the carrier exit 20 are formed in the shape of a slit corresponding to the cross-sectional shape of the strip wafer S. As the carrier portion 15, FIG. 8 shows a belt carrier but the carrier portion 15 is generally not limited to the example.

As the strip wafer S passes through the processing portion 17, the processing region 18 moves from one longitudinal end portion of the strip wafer S to the other. As a result, a predetermined region almost across the strip wafer S is processed by the processing portion 17. The carrier portion 15 sequentially carries a plurality of strip wafers S through the processing portion 17 one after another, whereby the plurality of strip wafers S are sequentially processed.

Since the processing region 18 corresponds to a partial region of the strip wafer S along the longitudinal direction as described above, it is easy to improve uniformity in processing. The width (along the lateral direction of the strip wafer S) of the processing region 18 is, for example, set as long as the width W of the strip wafer S, and the length (along the longitudinal direction of the strip wafer S) thereof is set, for example, as long as or less than the width W. When the strip wafer S has a width W of 3 cm and the processing portion 17 is a plasma etching system, plasma uniformity only has to be secured in about a 5- by 5-cm processing region 18.

This numeric data about the processing region 18 clearly shows that uniformity in processing only have to be secured in a region much smaller than that in an apparatus for processing an 8- or 12-inch-diameter circular wafer S0. Further, the transfer and processing of the strip wafer S are performed in parallel with great efficiency. Moreover, the processing portion 17 performs local processing on the common processing region 18 of the strip wafers S of various lengths L. Thus, even if the lengths L of the strip wafers S vary, equal processing is performed without any modification.

In this fashion, the semiconductor manufacturing apparatus according to the second preferred embodiment has the advantages of increasing uniformity in processing at a low cost, having high processing efficiency, and being adaptable with flexibility to the strip wafer S of any size which varies according to the volume of production.

Third Preferred Embodiment

Figure 9:
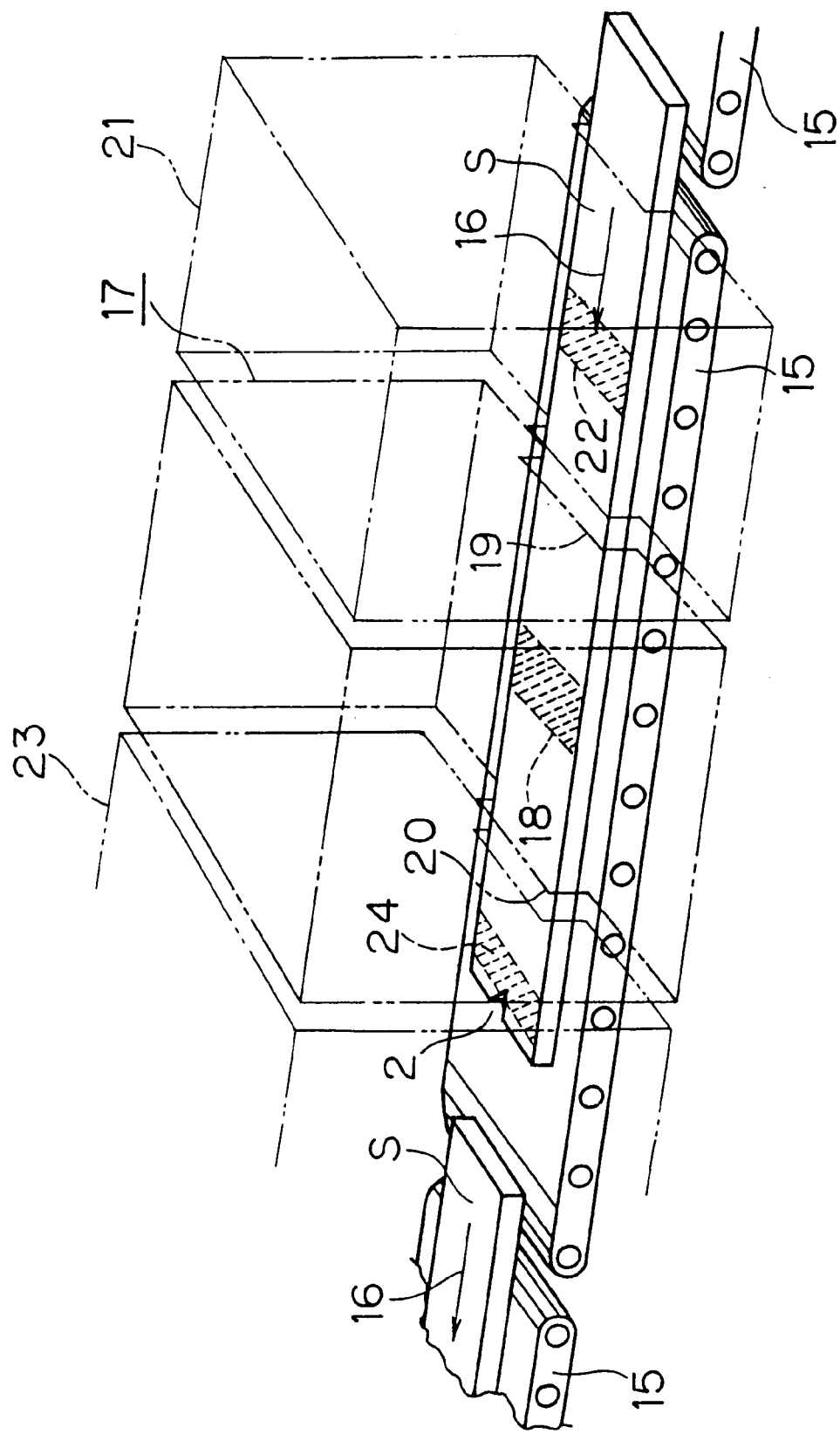
FIG. 9 is a perspective view of an apparatus according to a third preferred embodiment.

FIG. 9 is a perspective view showing a semiconductor manufacturing apparatus according to a third preferred embodiment. This apparatus is configured as a manufacturing line with a plurality of processing portions 21, 17, and 23 arranged along the carrier portion 15. Each of the plurality of processing portions 21, 17, and 23 performs different processing on the strip wafer S. For instance, the processing portions 21, 17, and 23 are a CVD (Chemical Vapor Deposit) device, an ion implanter, and a heater, respectively.

Like the processing portion 17, the processing portion 21 processes a processing region 22 which is a partial region of the strip wafer S along the longitudinal direction. The processing portion 23 processes a processing region 24 which is also a partial region of the strip wafer S. The plurality of processing portions 21, 17, and 23 are configured to process the strip wafers S of a common width W.

The strip wafer S is carried by the carrier portion 15, passing sequentially through the processing portions 21, 17, and 23, whereby for example CVD processing, ion implantation, and heat treatment are applied in sequence to the strip wafer S. As shown in FIG. 9, it could happen that front, central, and rear portions of a single strip wafer S are simultaneously processed by the processing portions 23, 17, and 21, respectively.

In contrast to the conventional manufacturing line wherein only single processing is performed for each circular wafer S0, this manufacturing line improves processing efficiency and further reduces a floor space for installation. This contributes to reduction in the manufacturing cost.

Figure 10:
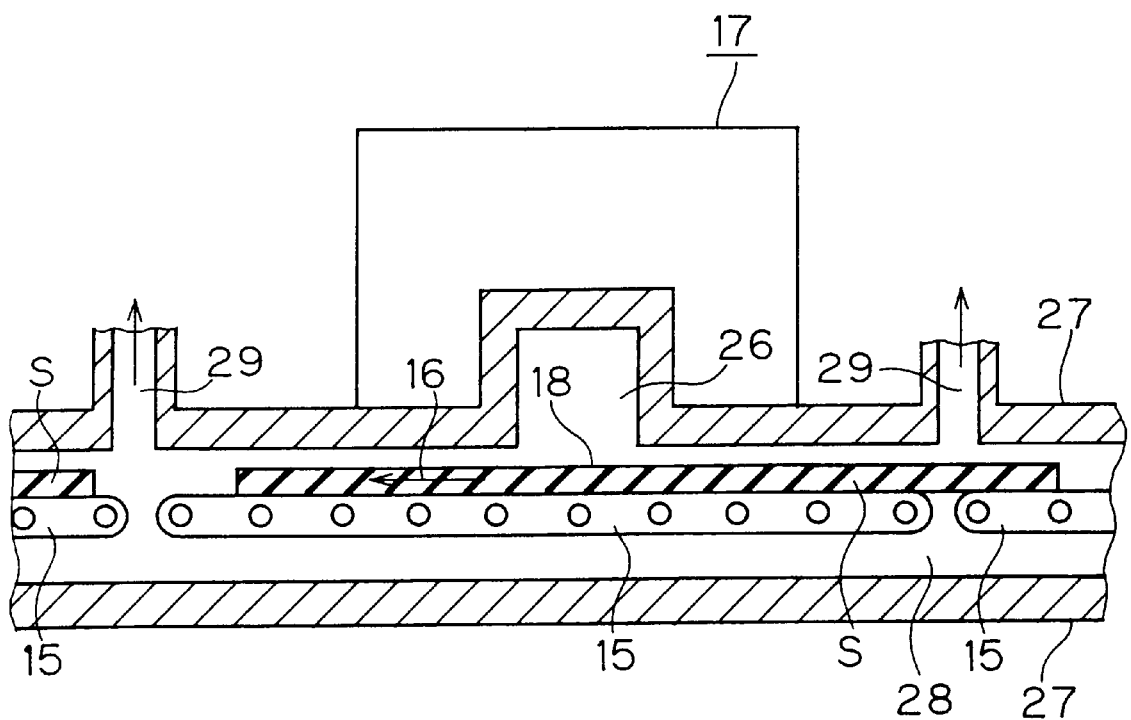
FIG. 10 is a side view showing a modification of FIG. 9.

Some types of the processing portions 21, 17, and 23 need to maintain the processing regions 22, 18, and 24 under vacuum. For instance, processing such as ion implantation and plasma etching is performed in a vacuum. In such a case, the carrier portion 15 may be formed within a vacuum vessel 27 as shown in FIG. 10. A vacuum chamber 28 provided in the vacuum vessel 27 is evacuated through vents 29 and in communication with a processing chamber 26 provided in the processing portion 17. The processing chamber 26 is formed to be opposed to the processing region 18. Thus, the processing region 18 is processed in a vacuum in the processing chamber 26.

Fourth Preferred Embodiment

Figure 11:
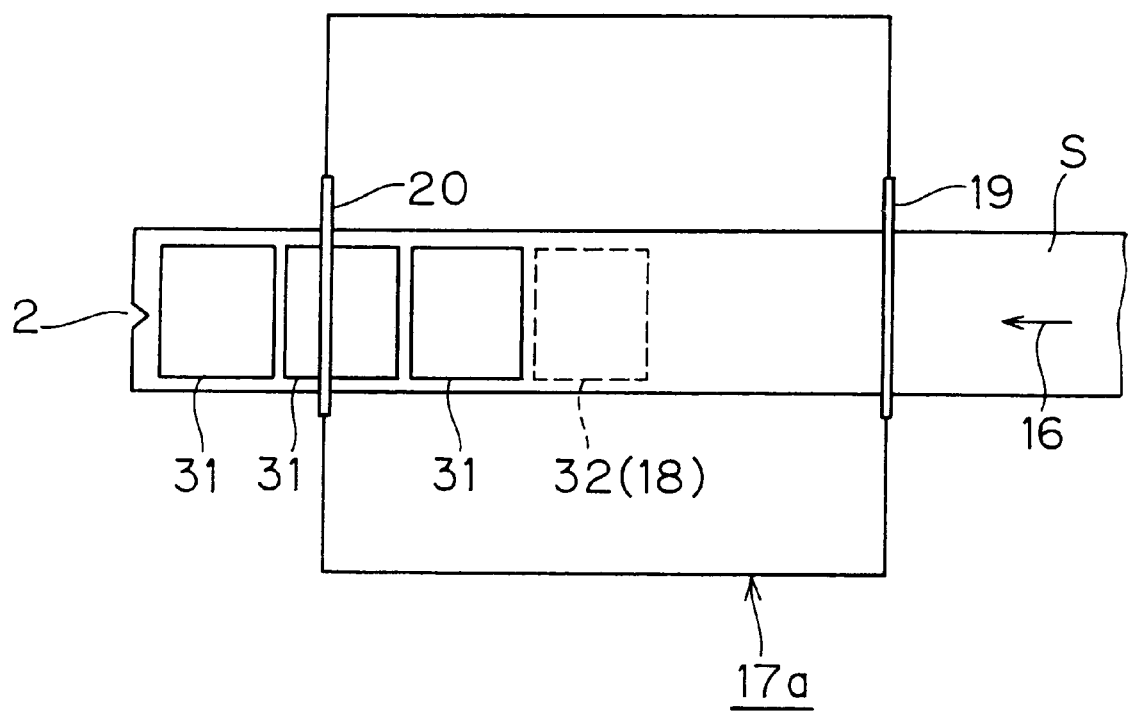
FIG. 11 is a plan view of an apparatus according to a fourth preferred embodiment.

FIG. 11 is a plan view showing a schematic configuration of one example of the processing portion 17 (FIG. 8). This processing portion 17a is configured as a transfer system for transferring a mask pattern. It transfers a mask pattern to a transfer region 32 (processing region 18) of the strip wafer S carried therein. Along with the move of the strip wafer S, mask patterns are transferred to a plurality of transfer regions 31 of the strip wafer S along the longitudinal direction.

Figure 12:
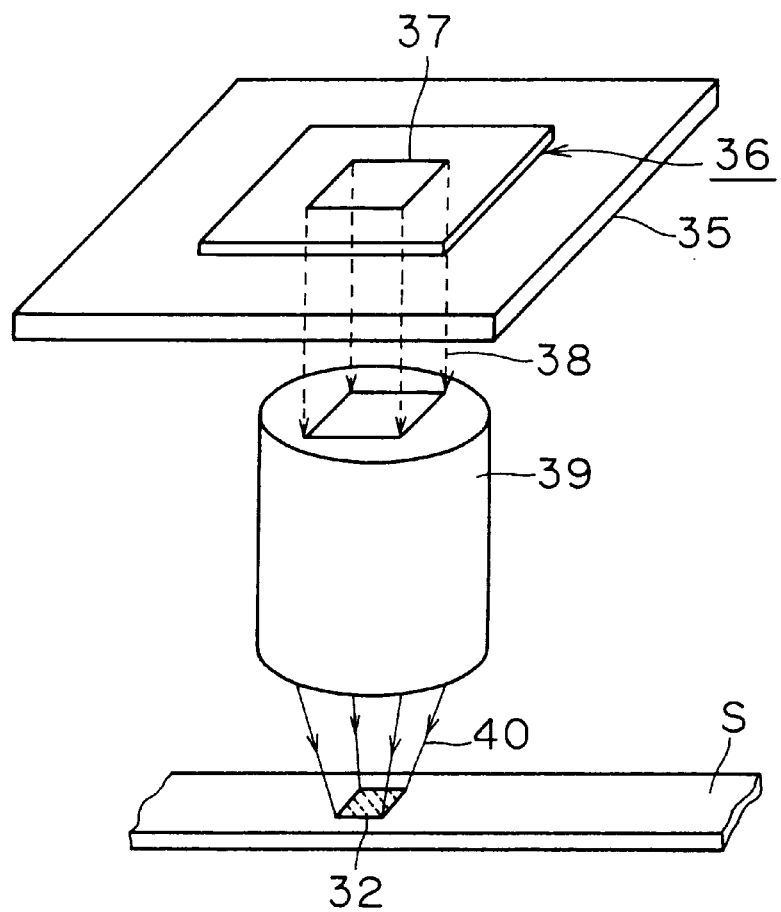
FIG. 12 is a perspective view showing principal portion of the apparatus of FIG. 11.

FIG. 12 is a perspective view showing principal part of the processing portion 17a. Like a well-known stepper, the processing portion 17a comprises a mask stage 35 and a lens 39. On the mask stage 35, a mask 36 is placed, in which a mask pattern 37 to be transferred is formed. Light 38 passing through the mask pattern 37 becomes convergent light 40 by passing through the lens 39, and enters the transfer region 32 on the strip wafer S. Consequently, the transfer region 32 is exposed in the form of a pattern corresponding to the mask pattern 37. That is, the mask pattern 37 is transferred to the transfer region 32.

Figure 13:
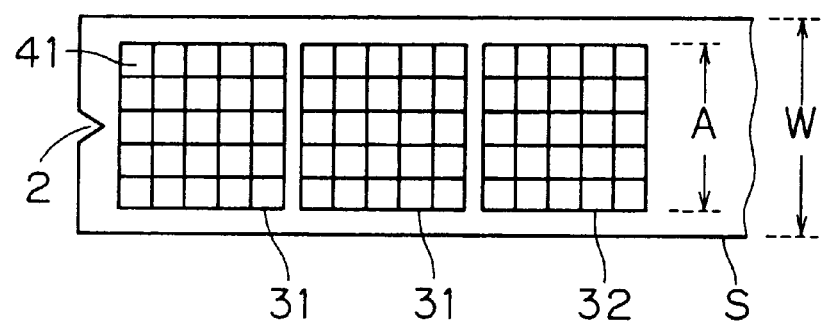
FIG. 13 is a plan view of a semiconductor wafer processed by the device of FIG. 11.

FIG. 13 illustrates the transfer regions 31 after exposure and the transfer region 32 during exposure. Exposure is performed for each transfer region 32 in a row. This improves transfer efficiency. The carrier portion 15 stops the strip wafer S during exposure, and after the completion of exposure of one transfer region 31, moves the strip wafer S into such a position that the next transfer region 31 is subjected to the exposure. In this fashion, the strip wafer S passing through the processing portion 17a moves intermittently. Although a conventional stepper type exposure apparatus requires high accuracy in moving a stage in both two horizontal directions (x and y), the processing portion 17a requires accuracy only in one direction.

The width A of the transfer region 32 corresponding to the field angle of the stepper is preferably set about as long as or somewhat smaller than the width W of the strip wafer S. This increases both transfer efficiency and resolution.

The processing portion 17a can be replaced by a particle beam exposure system which draws (i.e., exposes) a layout pattern without using a mask pattern by scanning a particle beam such as a convergent electron beam. The particle beam exposure system itself is configured like a conventional known system, therefore, it is not shown in the drawing. The particle beam exposure system can repeatedly scan a particle beam in a direction of the width W of the strip wafer S while moving the strip wafer S in the carrying direction 16.

In this fashion, the particle beam exposure system can also be adopted as the processing portion 17. This system further improves efficiency in drawing. Since the particle beam exposure system requires no mask pattern, it smoothes the way to draw different semiconductor chips on the same strip wafer S and is thus especially suited to be used in combination with the strip wafer S suitable for the flexible manufacturing system. A semiconductor manufacturing apparatus using this particle beam exposure system will be described in a fifteenth preferred embodiment.

Figure 14:
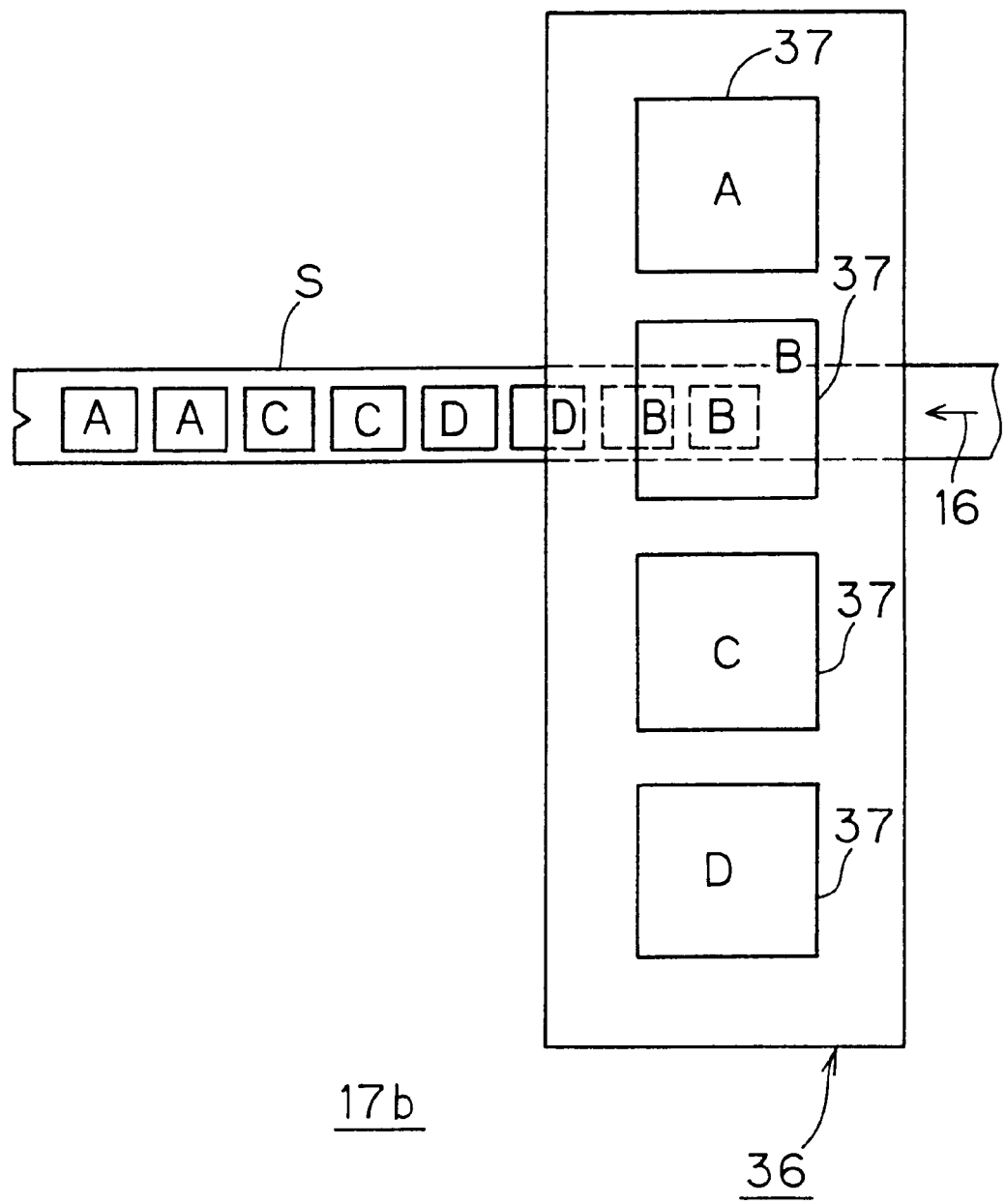
FIG. 14 is a plan view showing a modification of the device of FIG. 11.

The transfer system using a mask pattern can also be configured to transfer plural kinds of mask patterns to the same strip wafer S. A processing portion 17b shown in FIG. 14 is a prime example thereof. In the processing portion 17b, plural kinds of mask patterns 37 are formed in the mask 36. By appropriately sliding the mask 36 together with the move of the strip wafer S in the carrying direction 16, different mask patterns 37 can be transferred to the strip wafer S.

Figure 15:
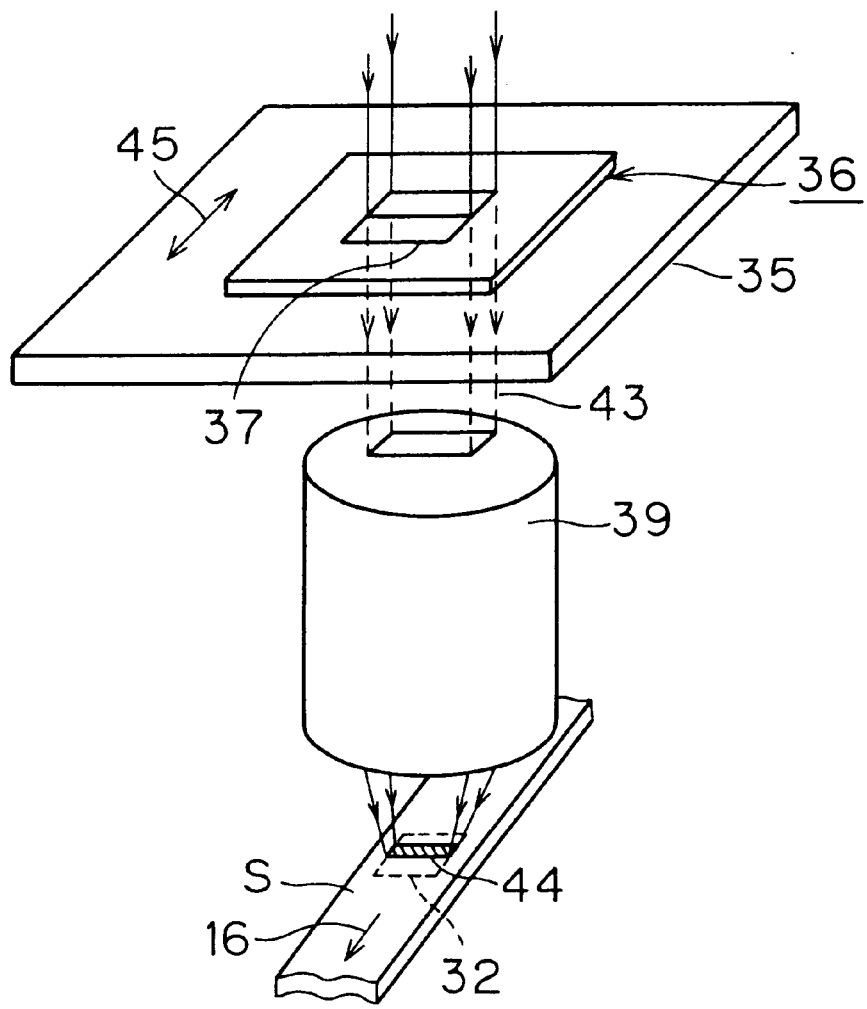
FIG. 15 is a plan view showing another modification of the device of FIG. 11.

It is also possible to configure the transfer system using a mask pattern as a scan exposure type transfer system. A processing portion 17c shown in FIG. 15 is a prime example thereof. In the processing portion 17c, light 43 is transmitted in the form of a slit through a partial region of the mask pattern 37 to be transferred, and passes through the lens 39. This temporarily exposes a slit transfer region 44 which corresponds to part of the transfer region 32 where the mask pattern 37 is to be transferred. Then, the mask stage 35 is moved in a direction of travel 45 simultaneously with the move of the strip wafer S in the carrying direction 16. Accordingly, after a predetermined period of time, the entire mask pattern 37 is transferred to the transfer region 32.

The processing portion 17c transfers only part of the mask pattern 37 at a time, so that it is easy to improve resolution. In addition, by setting the direction of travel 45 in parallel with the carrying direction 16, the transfer of the mask pattern can be performed simultaneously with the move of the strip wafer S. This improves transfer efficiency. Although the conventional scan exposure type transfer system requires high accuracy in moving a stage in both two horizontal directions (x and y), the processing portion 17c requires accuracy only in one direction.

Fifth Preferred Embodiment

Figure 16:
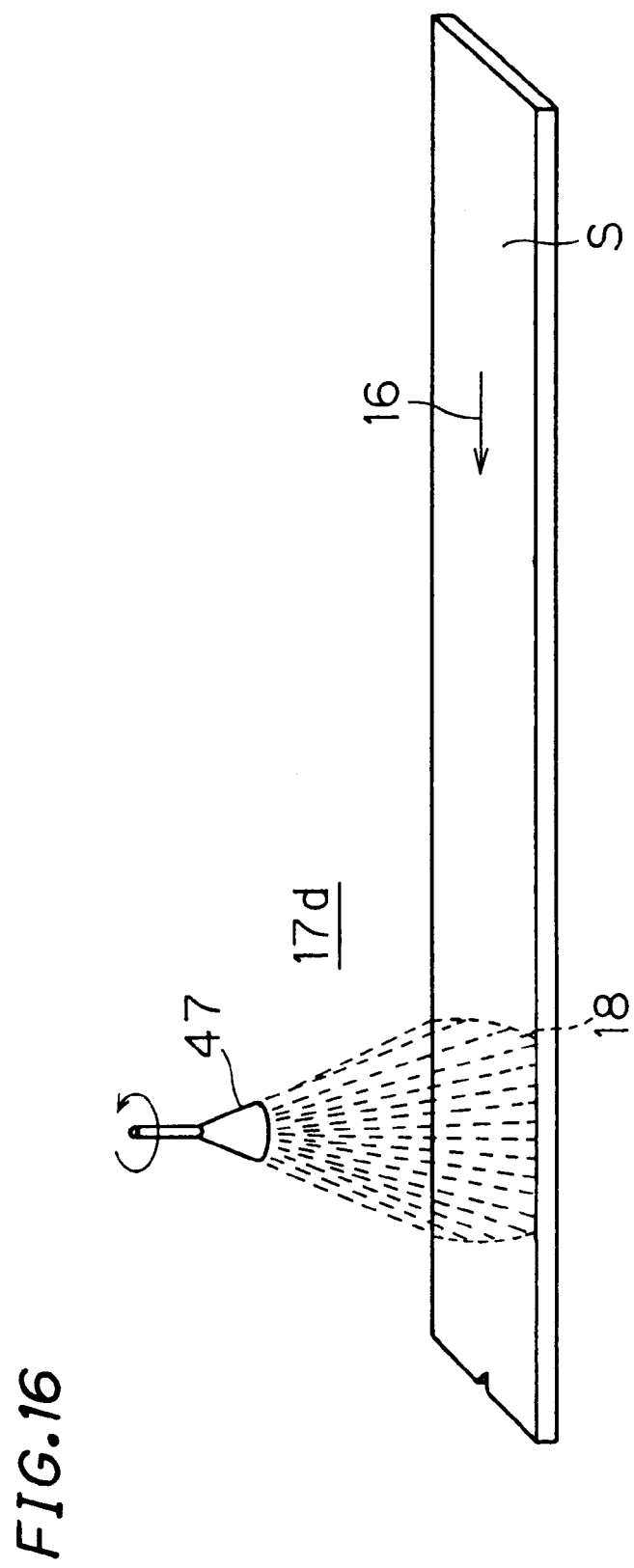
FIG. 16 is a perspective view of a device according to a fifth preferred embodiment.

FIG. 16 is a plane view showing a schematic configuration of another example of the processing portion 17 (FIG. 8). This processing portion 17d is configured as a coating system corresponding to a coater or a developer for the circular wafer S0. It comprises a shower head 47 above the strip wafer S. The shower head 47 sprays atomized resist fluid, or coating fluid such as a developing solution onto the strip wafer S therebelow. The sprayed coating fluid is applied to the processing region 18 corresponding to a local region of the strip wafer S. The strip wafer S continuously moves in the carrying direction 16 while receiving the application of coating fluid in the processing region 18.

In this fashion, the coating fluid is applied only to the limited processing region 18. Since the processing region 18 continuously runs on the strip wafer S, the entire main surface of the strip wafer is uniformly coated. In addition, as shown in FIG. 16, the shower head 47 may rotate around an axis perpendicular to the strip wafer S. This further improves uniformity in coating. To further improve uniformity, nozzles of the shower head 47 can be narrowed.

Sixth Preferred Embodiment

Figure 17:
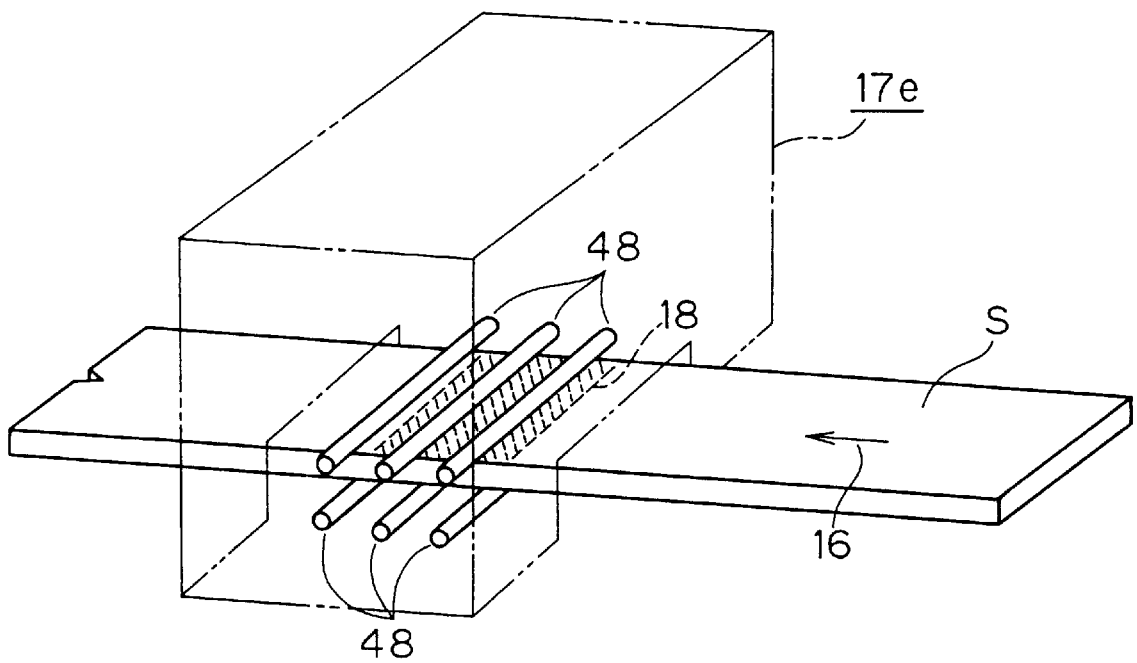
FIG. 17 is a perspective view of a device according to a sixth preferred embodiment.

FIG. 17 is a plan view showing a schematic configuration of still another example of the processing portion 17 (FIG. 8). This processing portion 17e is configured as a heating system, comprising heaters 48. The heaters 48 are provided both above and below the processing region 18 or either above or below, to apply heat treatment to the processing region 18.

The strip wafer S continuously moves in the carrying direction 16 while being subjected to heat treatment in the processing region 18. In this fashion, heat treatment is applied only to the limited processing region 18. Since the processing region 18 continuously runs on the strip wafer, the entire main surface of the strip wafer S is uniformly heated.

Seventh Preferred Embodiment

Figure 18:
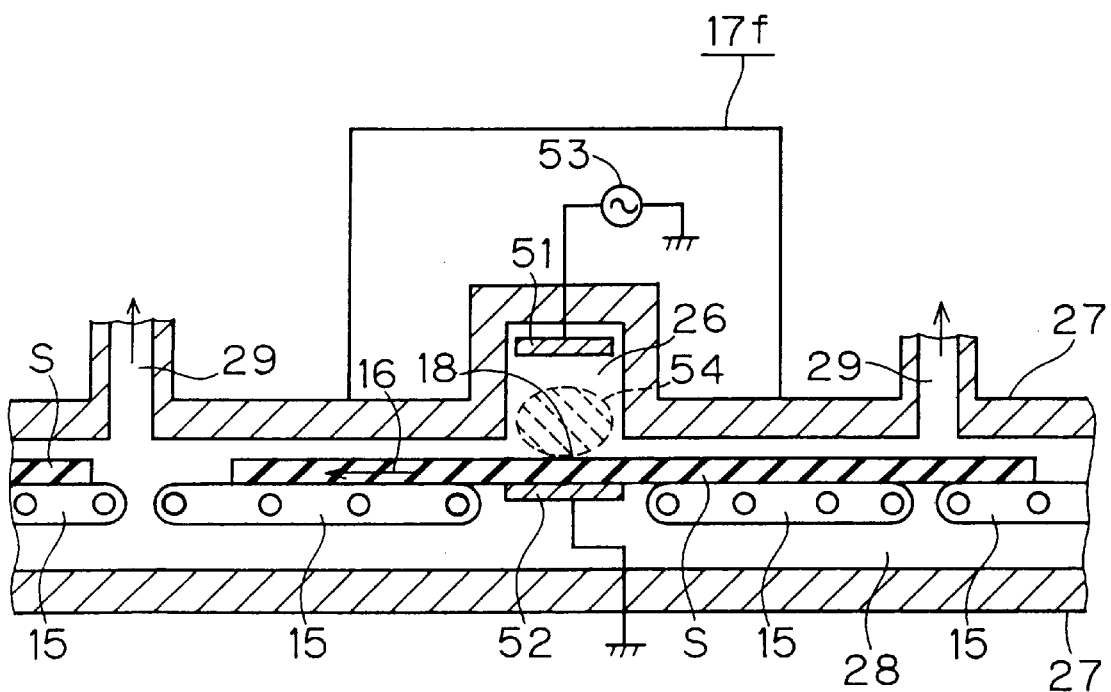
FIG. 18 is a side view of a device according to a seventh preferred embodiment.

FIG. 18 is a plan view showing still another schematic configuration of the processing portion 17 (FIG. 8). This processing portion 17f is configured as a plasma etching system. It comprises an upper electrode 51, a lower electrode 52, and a radio-frequency power supply 53. The processing chamber 26 is provided above the processing region 18. The upper electrode 51 is provided in the upper portion of the processing chamber 26 to be opposed to the strip wafer S. The lower electrode 52 is provided below the strip wafer S in the vacuum chamber 28, to be opposed to the upper electrode 51.

The processing chamber 26 is in communication with the vacuum chamber 28 and thus maintained under vacuum like the vacuum chamber 28. The upper electrode 51 is supplied with radio frequency wave by the radio-frequency power supply 53, whereas the lower electrode 52 is supplied with ground potential. The processing chamber 26 is supplied with lean gas for plasma production through a gas supply port not shown. The processing portion 17f configured in this manner produces plasma 54 in the processing chamber 26.

As a result, the main surface of the strip wafer S is locally exposed to the plasma 54 in the processing region 18 and thereby subjected to dry etching using plasma. While etched in the processing region 18, the strip wafer S continuously moves in the carrying direction 16. In this fashion, the plasma 54 only has to be produced uniformly in the limited processing region 18. Since the processing region 18 continuously runs the strip wafer S, the entire main surface of the strip wafer S is uniformly etched.

As for the plasma etching system itself, there has been various well-known types as described in "Nikkei Microdevices", FIG. 10, December (1998), pp. 114–115, such as a system for supplying radio frequency wave individually to the upper and lower electrodes or a system for supplying both radio frequency wave and microwave. These various types of plasma etching systems can be substituted for the processing portion 17f of FIG. 18, thereby to obtain the same effect.

Eighth Preferred Embodiment

Figure 19:
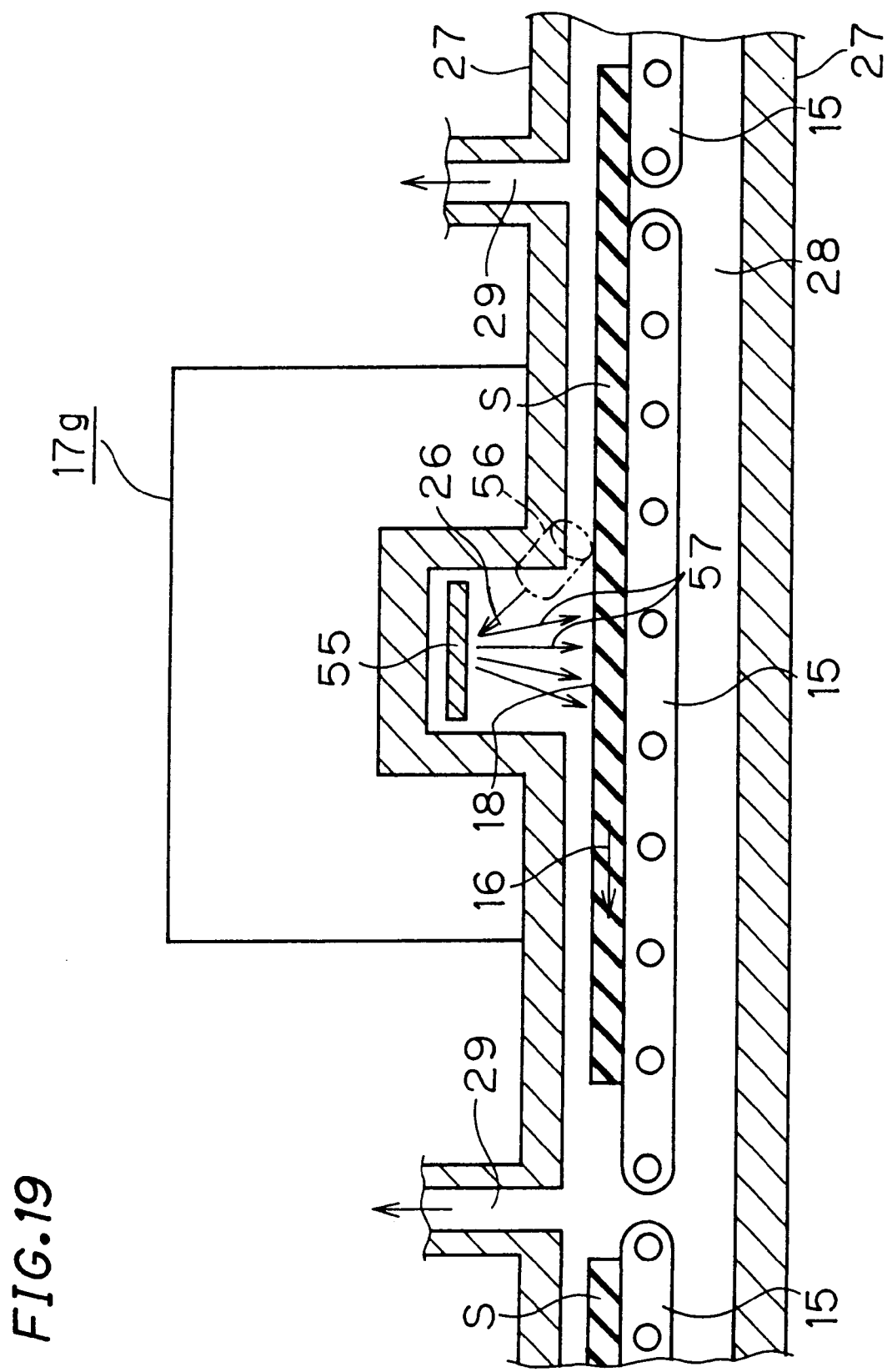
FIG. 19 is a side view of a device according to an eighth preferred embodiment.

FIG. 19 is a plan view showing a schematic configuration of still another example of the processing portion 17 (FIG. 18). This processing portion 17g is configured as a sputtering system. It comprises a target 55 and a beam generator 56. The processing chamber 26 is formed above the processing region 18, and the target 55 is provided in an upper portion of the processing chamber 26 to be opposed to the strip wafer S.

The processing chamber 26 is in communication with the vacuum chamber 28 and thus maintained under vacuum like the vacuum chamber 28. The beam generator 56 irradiates the target 55 with a particle beam such as argon (Ar). Consequently, constitutive elements of the target 55 are emitted therefrom as sputter particles 57, whereby the main surface of the strip wafer S is locally irradiated with the sputter particles 57 in the processing region 18. The sputter particles 57 are, for example, deposited over the strip wafer S to form a deposition layer.

While irradiated with the sputter particles 57 in the processing region 18, the strip wafer S continuously moves in the carrying direction 16. In this fashion, only the limited processing region 18 has to be uniformly irradiated with the sputter particles 57. Since the processing region 18 continuously runs on the strip wafer S, the entire main surface of the strip wafer S is uniformly irradiated.

Ninth Preferred Embodiment

Figure 20:
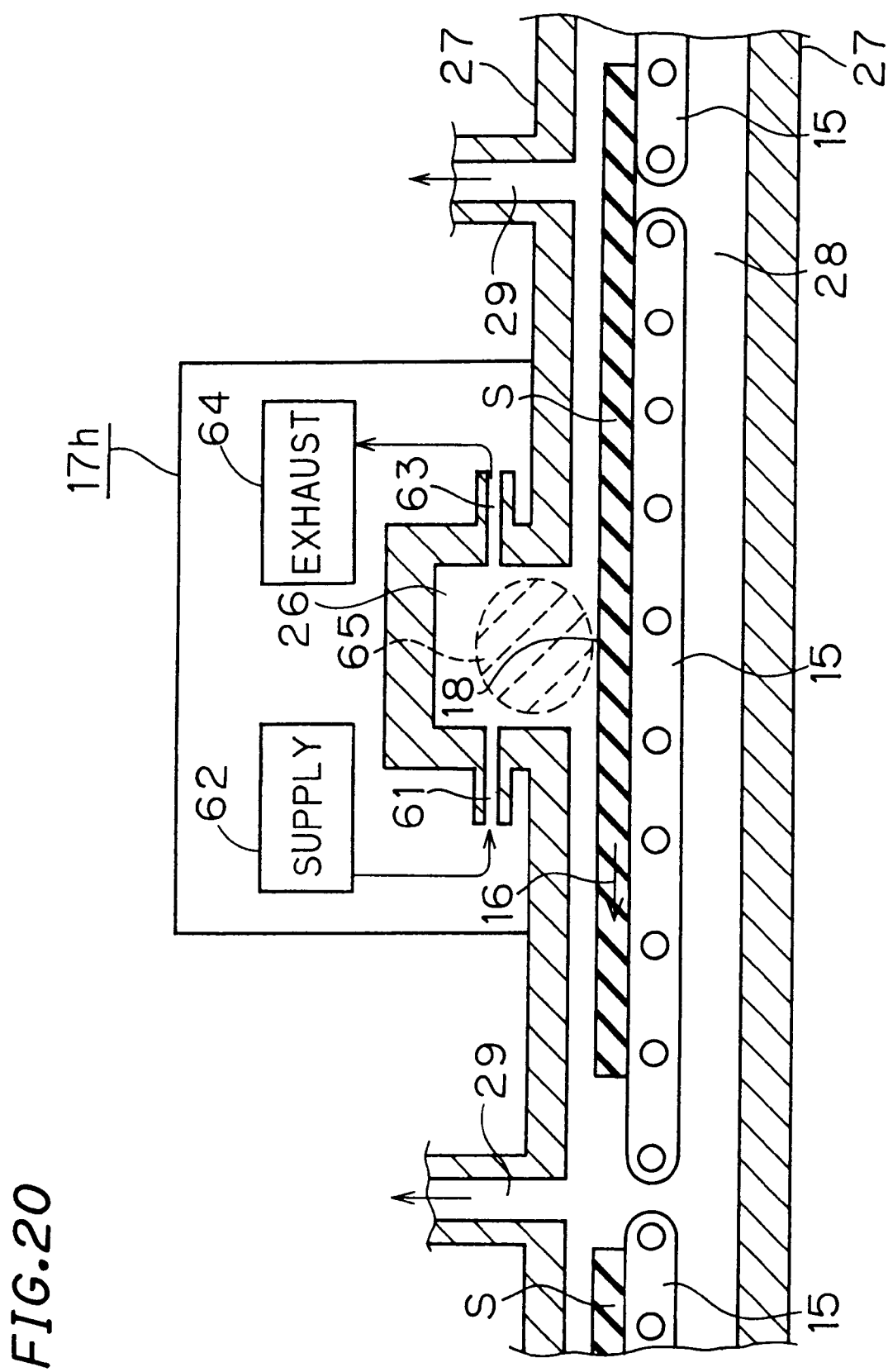
FIG. 20 is a side view of a device according to a ninth preferred embodiment.

FIG. 20 is a plan view showing a schematic configuration of still another example of the processing portion 17 (FIG. 8). This processing portion 17h is configured as a CVD device, in which the processing chamber 26 is provided above the processing region 18. A gas supply portion 62 supplies reactive gas to the processing chamber 26 through a gas supply port 61. Residual unreacted gas in the processing chamber 26 and secondary gas produced by reaction are exhausted through a gas exhaust port 63 to a gas exhaust port 64. The processing chamber 26 is in communication with the vacuum chamber 28 and thus maintained under a reduced pressure like the vacuum chamber 28.

In such a processing portion 17h, the main surface of the strip wafer S is locally exposed to the reactive gas in the processing region 18. The reactive gas forms a deposition layer by CVD processing on the strip wafer S. While the deposition layer is formed in the processing region 18 by CVD, the strip wafer S continuously moves in the carrying direction 16. In this fashion, the reactive gas only has to be supplied uniformly to the processing region 18. Since the processing region 18 continuously runs on the strip wafer S, the entire main surface of the strip wafer S is uniformly subjected to the CVD processing.

Tenth Preferred Embodiment

Figure 21:
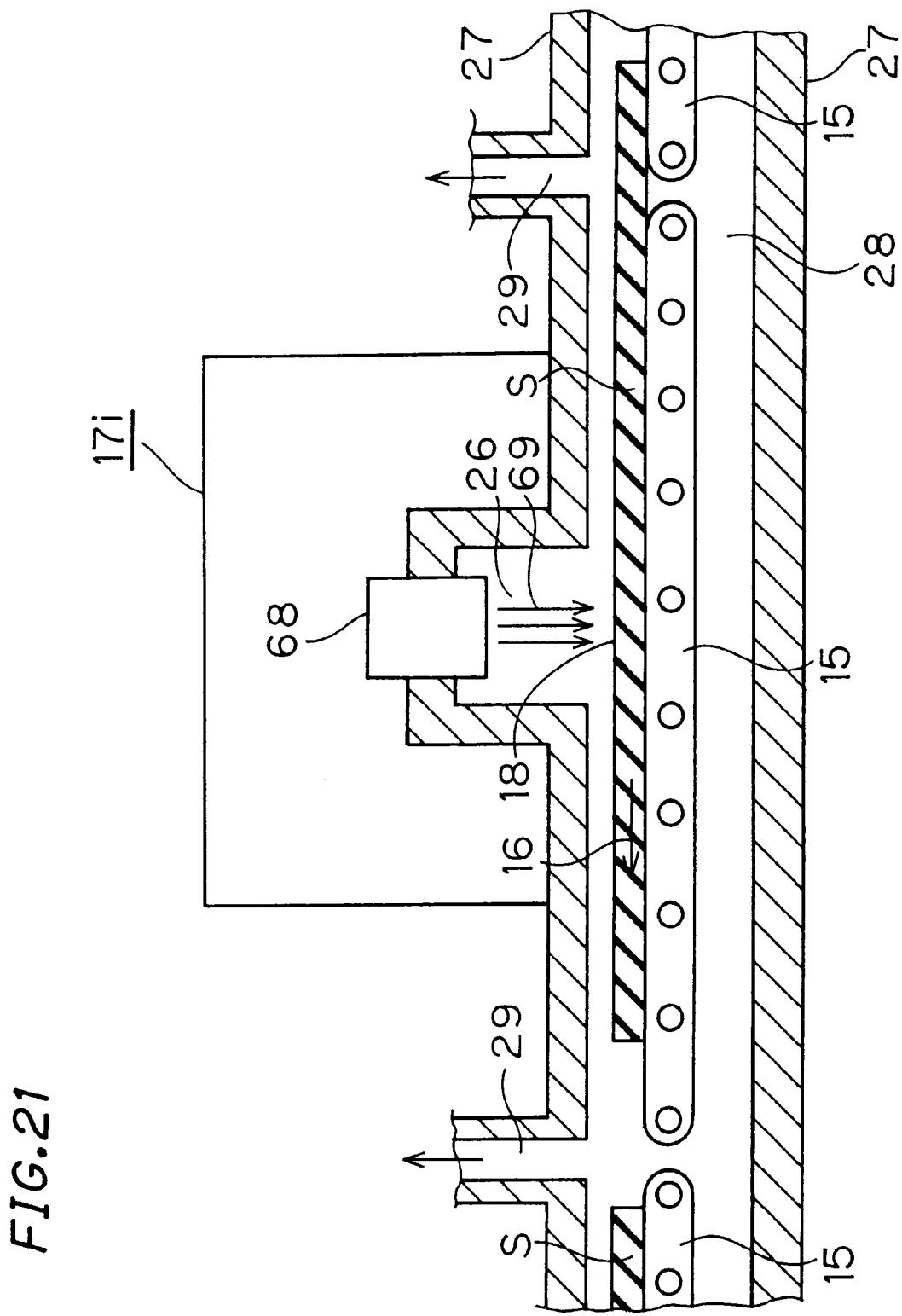
FIG. 21 is a side view of a device according to a tenth preferred embodiment.

FIG. 21 is a plan view showing a schematic configuration of still another example of the processing portion 17 (FIG. 18). This processing portion 17i is configured as an ion implantor, wherein the processing chamber 26 is provided above the processing region 18 and an ion beam generator 68 is provided in the upper portion of the processing chamber 26. The processing chamber 26 is in communication with the vacuum chamber 28 and thus maintained under vacuum like the vacuum chamber 28.

In such a processing portion 17i, the main surface of the strip wafer S is locally irradiated with ions produced by the ion beam generator 68, in the processing region 18. Those ions are implanted into the strip wafer S. While implanted with ions in the processing region 18, the strip wafer S continuously moves in the carrying direction 16. In this fashion, only the limited processing region 18 has to be uniformly irradiated with implantation ions. Since the processing region 18 continuously runs on the strip wafer S, the entire main surface of the strip wafer S is uniformly implanted with ions.

Eleventh Preferred Embodiment

Figure 22:
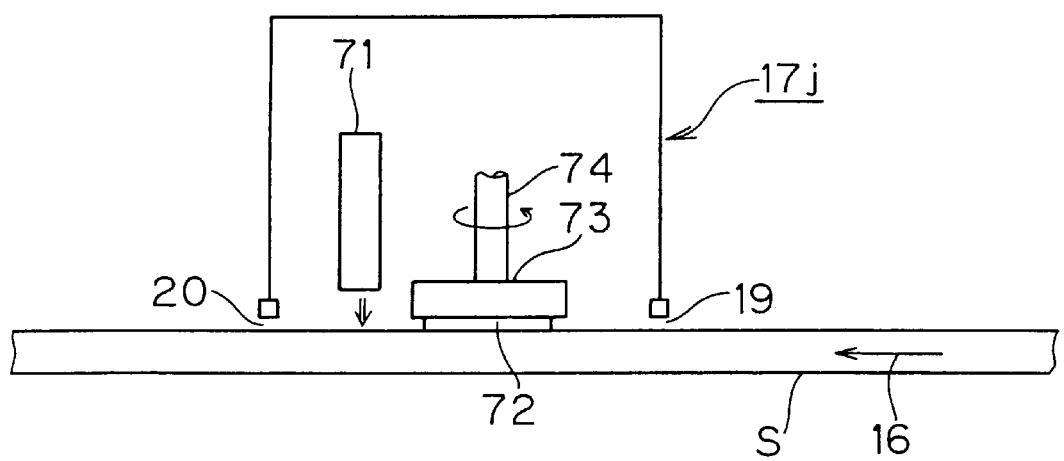
FIG. 22 is a side view of a device according to an eleventh preferred embodiment.

FIG. 22 is a plan view showing a schematic configuration of still another example of the processing portion 17 (FIG. 8). This processing portion 17j is configured as a CMP (Chemical Machinery Polishing) device. It is provided with a head 73 to be opposed to the processing portion 18 of the strip wafer S. On the underside of the head 73 which is opposed to the main surface of the strip wafer S, a polishing cloth 72 is stuck. The head 73 is pressed against the main surface of the strip wafer S while rotatably driven through a rotation axis 74 connected thereto.

In the vicinity of the head 73, a chemical fluid supply nozzle 71 is provided to apply chemical fluid such as slurry for polishing. The processing region 18 is thus polished by chemical action of the chemical fluid and mechanical friction between the polishing cloth 72 ant the strip wafer S. Polishing does not have to be performed in a vacuum.

While polished in the processing region 18, the strip wafer S continuously moves in the carrying direction 16. In this fashion, the CMP processing only has to be uniformly performed in the limited processing region 18. Since the processing region 18 continuously runs on the strip wafer S, the entire main surface of the strip wafer S is uniformly subjected to the CMP processing.

Twelfth Preferred Embodiment

Figure 23:
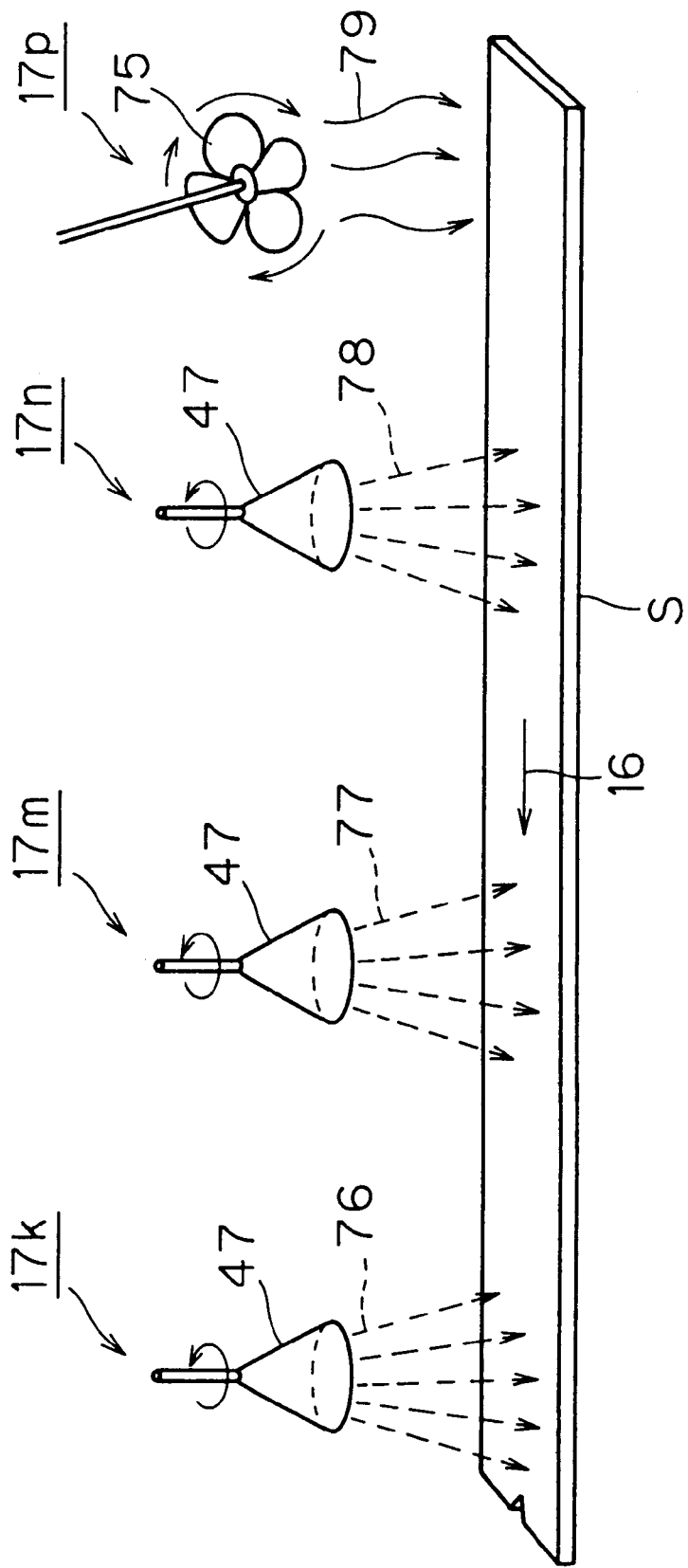
FIG. 23 is a perspective view of an apparatus according to a twelfth preferred embodiment.

FIG. 23 is a plan view showing a schematic configuration of one example of the semiconductor manufacturing apparatus of FIG. 9. This apparatus comprises a plurality of processing portions including a processing portion 17k for supplying an etching solution, a processing portion 17m for supplying pure water, a processing portion 17n for supplying alcohol, and a processing portion 17p for drying.

Each of the processing portions 17k, 17m, and 17n comprises a shower head 47 as shown in FIG. 16. Like the processing portion 17d, the processing portions 17k, 17m, and 17n supply a shower of etching solutions 76, a shower of pure water 77, and a shower of alcohol 78, respectively.

The processing portion 17p comprises a fan 75 which rotates to blow air 79 against the processing region 18 of the strip wafer S.

By passing through these four processing portions 17k, 17m, 17n, 17p in sequence, the strip wafer S is first supplied with the etching solution, then cleaned by pure water, then cleaned by alcohol, and finally dried by air. That is, the strip wafer S is subjected to a continuous series of wet etching process while passing through the four processing portions. This increases efficiency in wet etching process and saves a floor space required for the processing.

Thirteenth Preferred Embodiment

Figure 24:
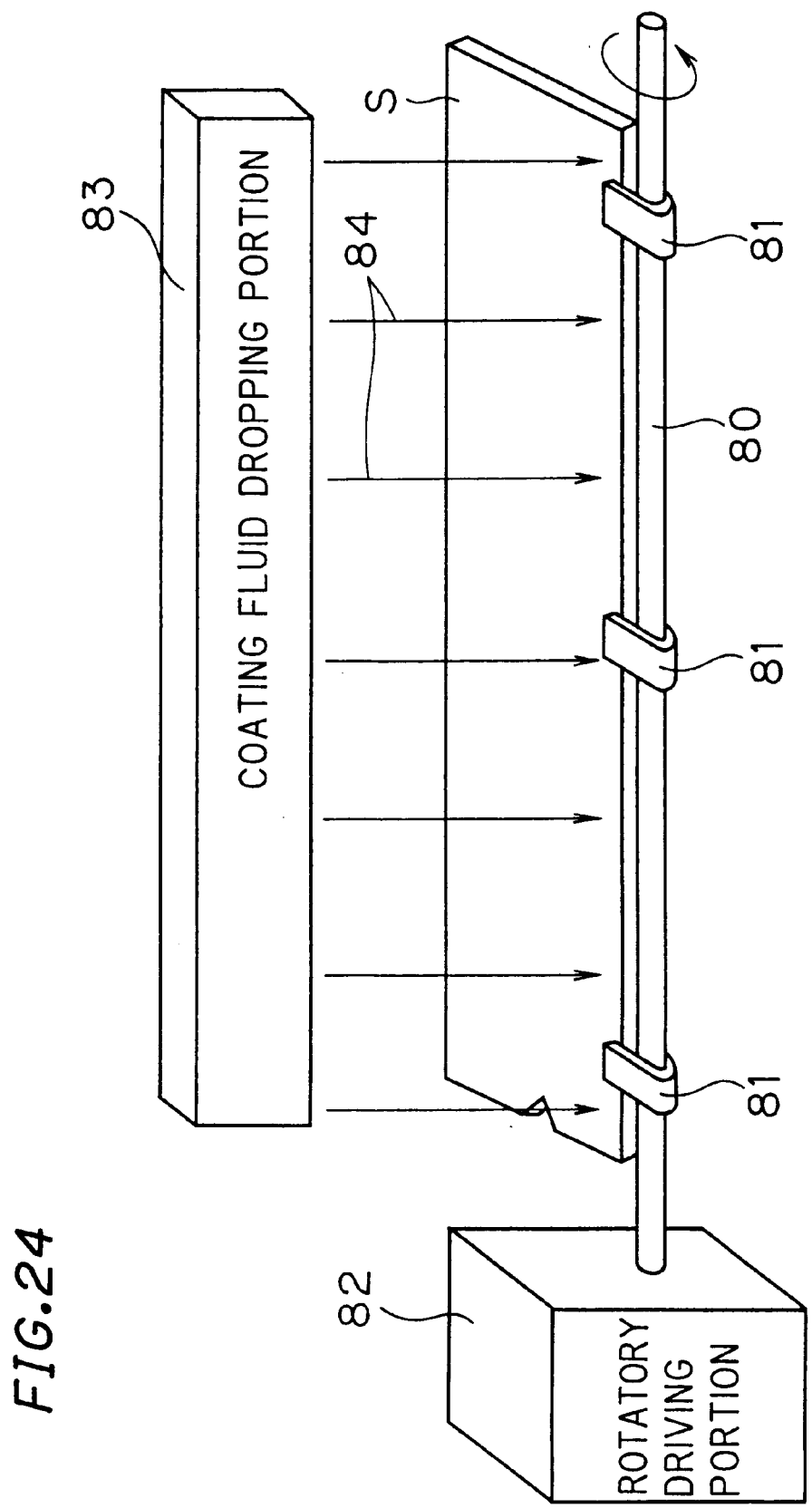
FIG. 24 is a perspective view of an apparatus according to a thirteenth preferred embodiment.

FIG. 24 is a perspective view showing another example of the semiconductor manufacturing apparatus for manufacturing a semiconductor device, using the strip wafer S which is manufactured by the manufacturing method of a semiconductor wafer according to the first preferred embodiment. This manufacturing apparatus is configured as a coating system corresponding to a coater or a developer for the circular wafer S0. It comprises a supporting bar 80, holding portions 81, a rotatory driving portion 82, and a coating fluid dropping portion 83.

The holding portions 81 are fixed to the supporting bar 80 to support the strip wafer S by holding the longitudinally extending edge of the strip wafer S so as to be opposed to the supporting bar 80. The supporting bar 80 is rotatably driven by the rotatory driving portion 82. With rotation of the supporting bar 80, the strip wafer S rotates around the supporting bar 80 as a rotation axis. The coating fluid dropping portion 83 provided above the supporting bar 80 drops coating fluid along the edge of the strip wafer S opposed to the supporting bar 80. The coating fluid is, for example, resist fluid or a developing solution.

The direction of rotation of the strip wafer S is selected so that the main surface supplied with the coating fluid moves forward. As a result, by centrifugal force, the coating fluid evenly spreads from the edge of the strip wafer S opposed to the supporting bar 80 to the opposite edge. When the coating fluid is resist fluid, a resist film of an uniform thickness is formed on the entire main surface of the strip wafer S.

Fourteenth Preferred Embodiment

Figure 25:
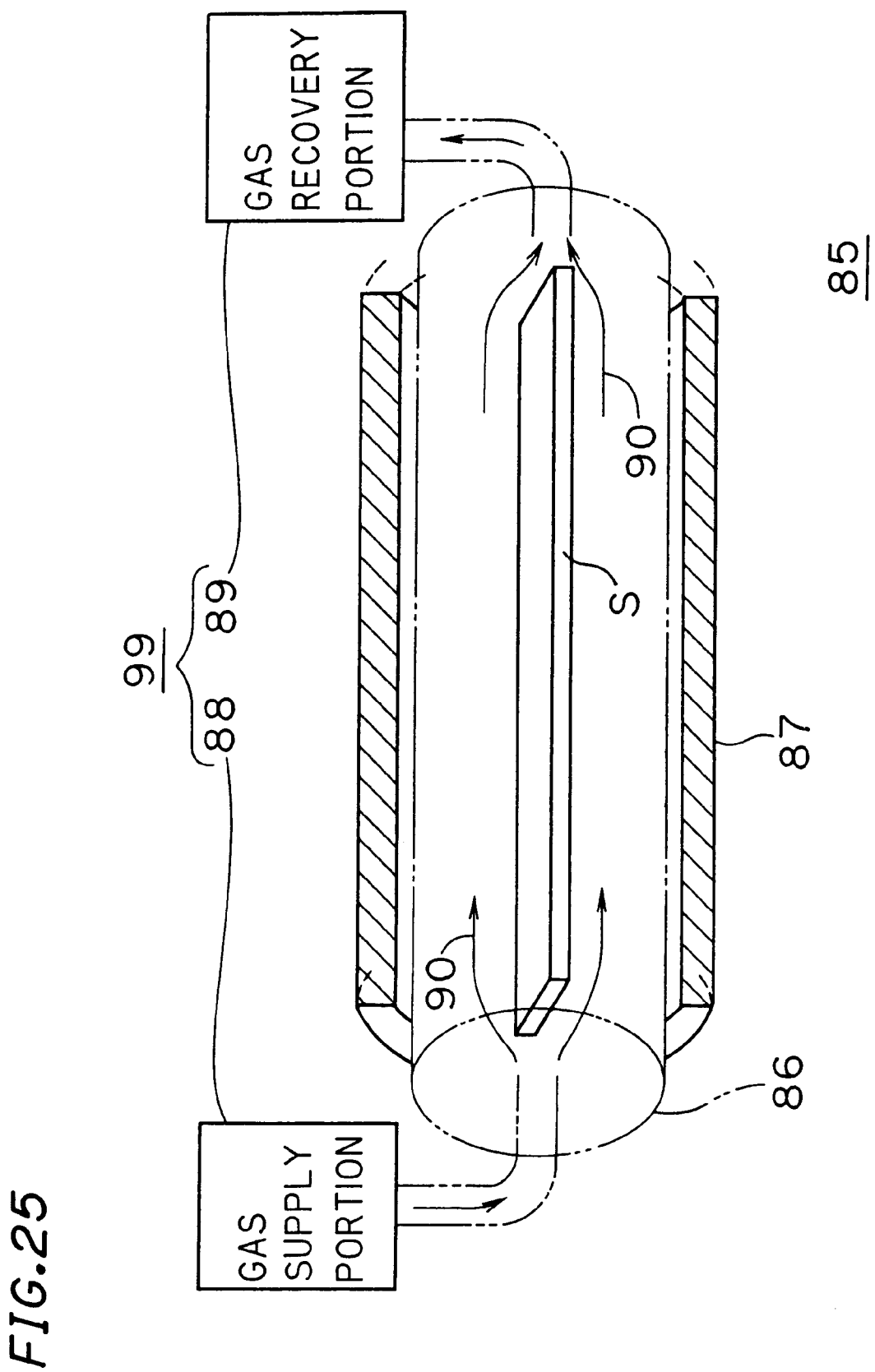
FIG. 25 is a perspective view of an apparatus according to a fourteenth preferred embodiment.

FIG. 25 is a perspective view showing still another example of the semiconductor manufacturing apparatus for manufacturing a semiconductor device, using the strip wafer S which is manufactured by the manufacturing method of a semiconductor wafer according to the first preferred embodiment. This apparatus 85 is configured as a heat treatment system available for processing such as heat treatment, thermal oxidation, and CVD processing. It comprises a cylinder 86, a heating portion 87, a gas supply portion 88, and a gas recovery portion 89.

The cylinder 86 accommodates the strip wafer S longitudinally along the central axis. The heating portion 87 is a member which is provided around the cylinder 86 and heats the accommodated strip wafer S. It comprises, for example, an electric heating wire. The gas supply portion 88 supplies gas such as reactive gas for CVD processing from one end of the cylinder 86 along the central axis, to the inside of the cylinder 86. The gas recovery portion 89 recovers that gas from the other end of the cylinder 86. This forms a gas stream 90 flowing from one end to the other in the cylinder 86. The gas supply portion 88 and the gas recovery portion 89 constitutes a gas circulating portion 99.

Figure 26:
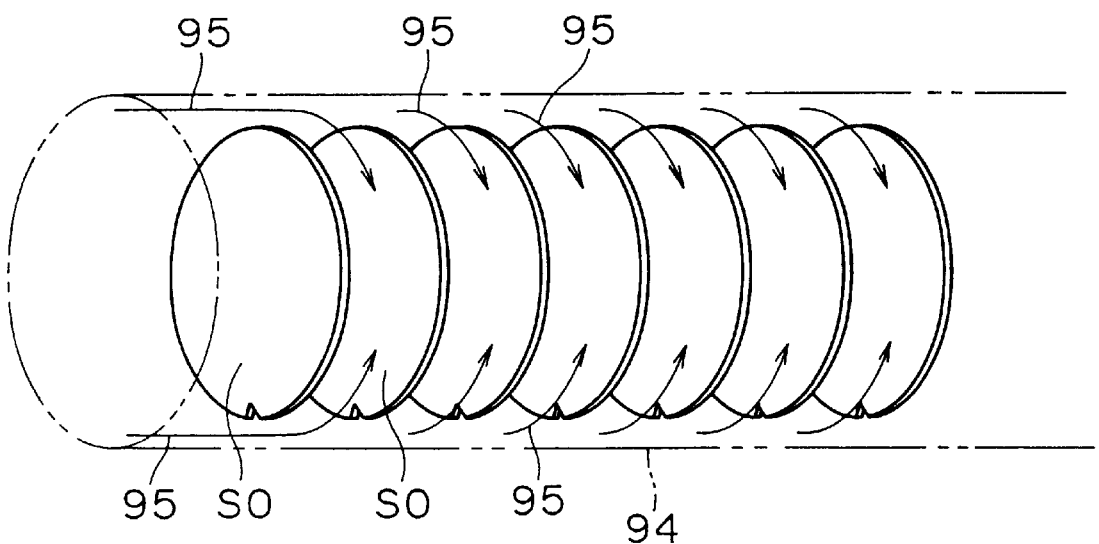
FIG. 26 is a perspective view of a conventional apparatus to be compared with FIG. 25.

In a heat treatment apparatus 93 for the conventional circular wafer S0, as shown in FIG. 26, the circular wafer S0 is accommodated, perpendicular to the central axis, in a cylinder 94, preventing a gas stream 95. This makes it difficult to uniformly supply gas across the entire circular wafer S0.

In the heat treatment system 85 of the fourteenth preferred embodiment, on the other hand, the strip wafer S is accommodated in parallel with the central axis of the cylinder 86 as shown in FIG. 25. In this case, the strip wafer S does not prevent the gas stream 90. This allows uniform gas supply across the strip wafer S. In addition, a required area of the strip wafer S can be ensured by increasing the length L thereof while reducing the width W. This allows reduction in the internal diameter of the cylinder 86, thereby further improving uniformity in the gas stream 90.

Increase in the uniformity of gas supply to the strip wafer S is followed by increase in uniformity in processing of the strip wafer S. When gas is reactive gas for CVD processing, for example, a thickness of a CVD film to be deposited on the main surface of the strip wafer S becomes more uniform. The heat treatment system 85 may place the cylinder 86 (central axis) in either a horizontal or vertical position. The former heat treatment system 85 functions as a horizontal furnace and the latter as a vertical furnace. The horizontal furnace has the advantage of easy taking in and out of the strip wafer S; and the vertical furnace has the advantage of greater uniformity in the gas stream 90.

Figure 27:
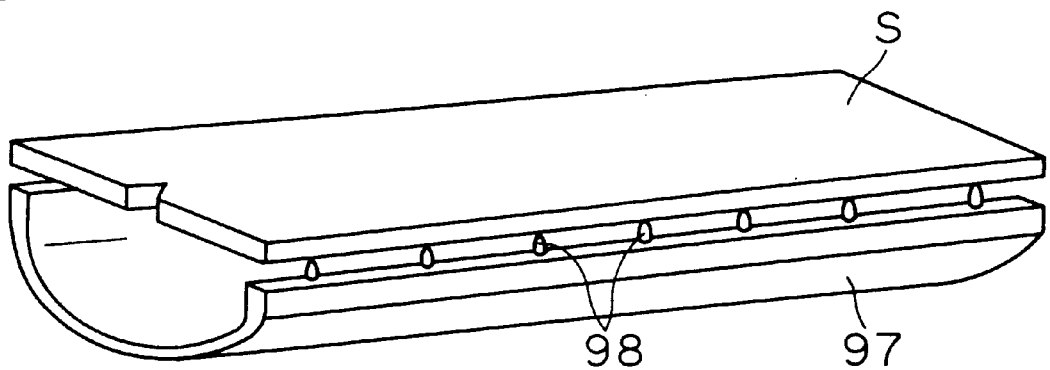
FIG. 27 is a perspective view showing a member of the apparatus of FIG. 25.
Figure 28:
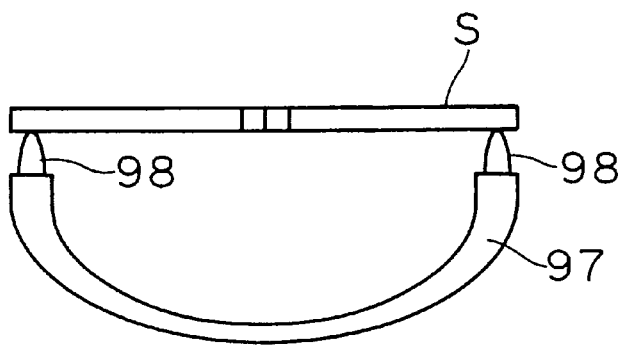
FIG. 28 is a front view of FIG. 27.

To accommodate the strip wafer S in the cylinder 86 without preventing the gas stream 90, a boat 97 shown in FIGS. 27 and 28 may be used. FIG. 27 is a perspective view and FIG. 28 is a front view of the boat 97. The boat 97 is made of quartz and provided in the shape of a curved plate having an arc cross section. Along the edges of the boat 97, protuberant pawls 98 are provided. The strip wafer S is placed on the pawls 98 and accommodated together with a the boat 97 in the cylinder 86. Since the strip wafer S is only in contact with the pawls 98, generation of particles due to contact can be suppressed.

Figure 29:
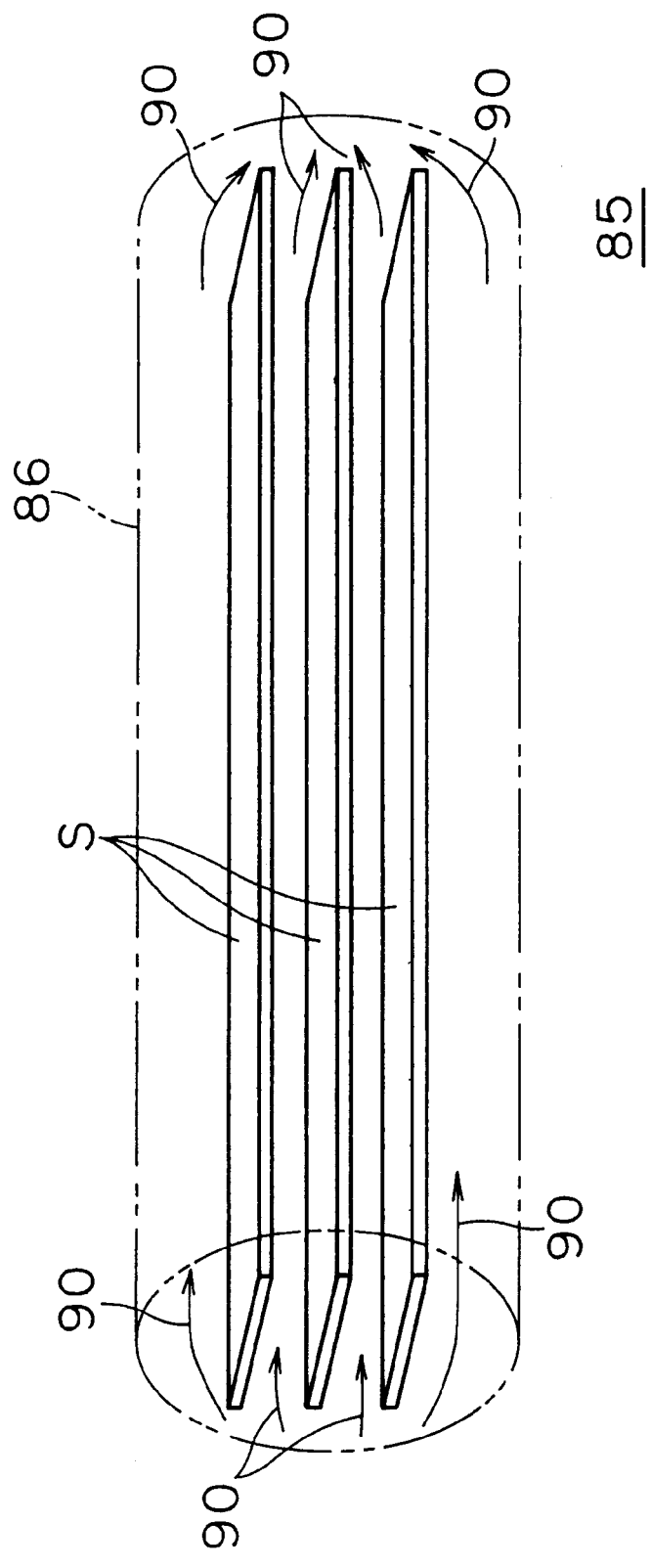
FIG. 29 is a perspective view of a modification of the apparatus of FIG. 25.

As shown in FIG. 29, the cylinder 86 can also accommodate a plurality of strip wafers S. The plurality of strip wafers S are accommodated in parallel with each other at regular intervals. In this case, also, they do not prevent the gas stream, so that high uniformity in the gas stream 90 is maintained. Besides, the plurality of strip wafers S are processed simultaneously. This improves efficiency in processing.

Figure 30:
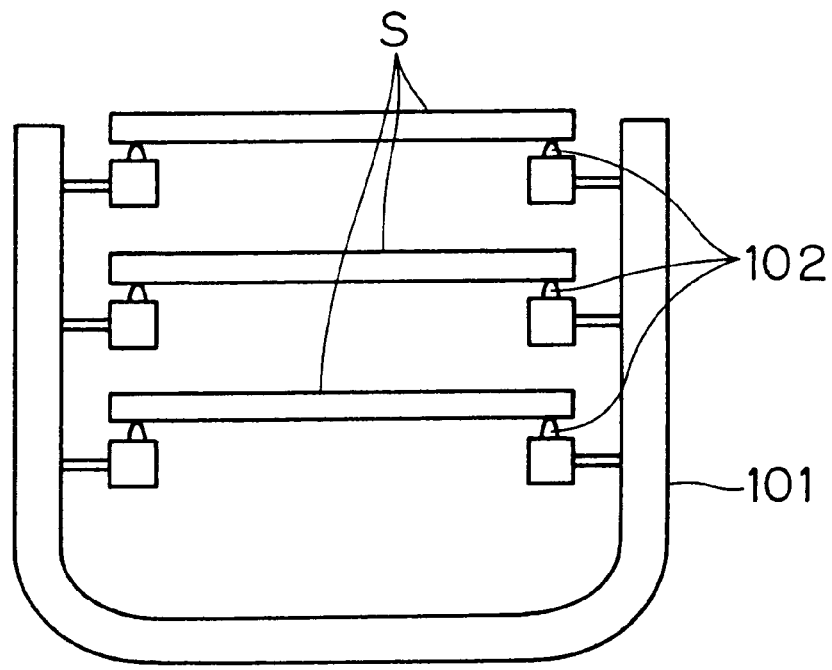
FIG. 30 is a front view showing a member of the apparatus of FIG. 29.

To accommodate a plurality of strip wafers S in the cylinder 86 without preventing the gas stream 90, a boat 101 shown in FIG. 30 may be used. The boat 101 is made of quartz and provided in the shape of a curved plate having a U-shaped cross section. Along the facing side wall surfaces, protuberant pawls 102 are provided on multi steps. Placed on the pawls 102, the plurality of strip wafer S are maintained in parallel with each other at regular intervals. In this configuration, they are accommodated together with the boat 101 in the cylinder 86.

Figure 31:
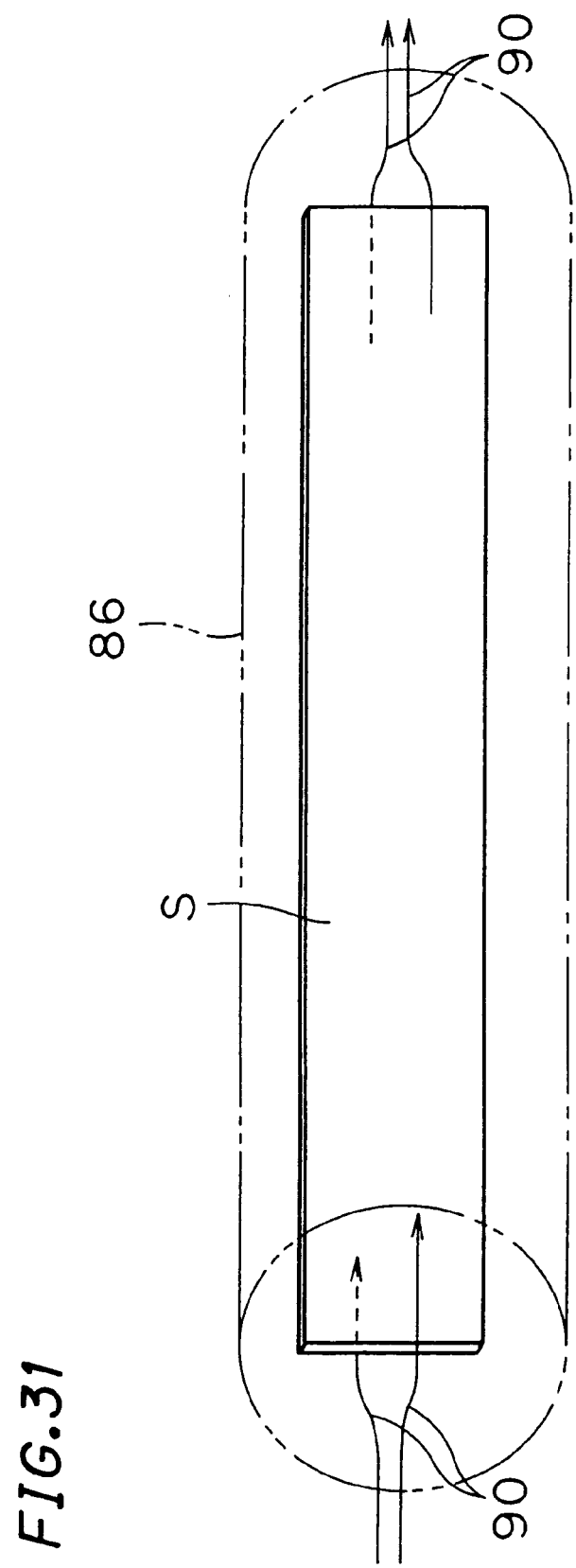
FIG. 31 is a perspective view of another modification of the apparatus of FIG. 25.

As shown in FIG. 31, the cylinder 86 can also accommodate the strip wafer S in a vertical position. This suppresses distortion of the strip wafer S due to application of heat and thus prevents generation of defects due to distortion.

Figure 32:
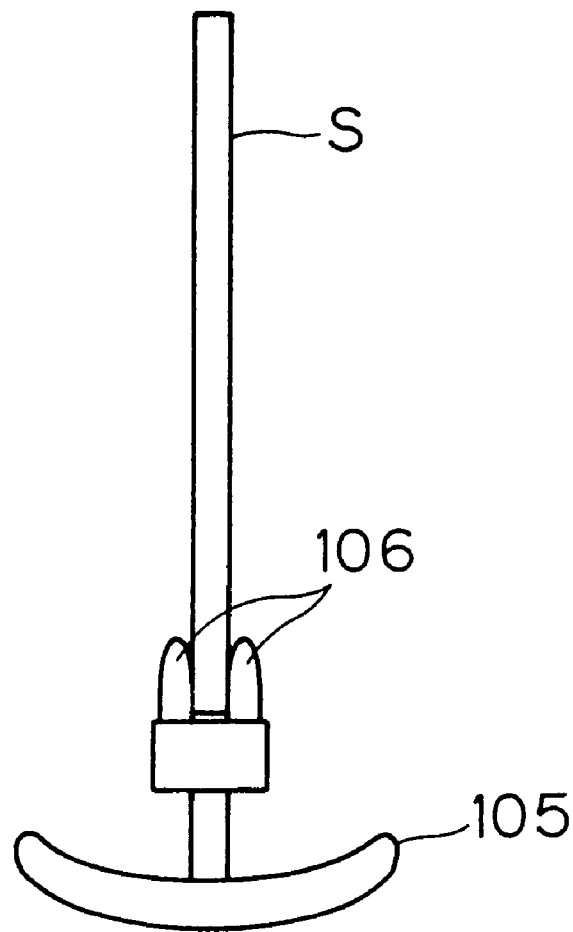
FIG. 32 is a front view showing a member of the apparatus of FIG. 31.

To accommodate the strip wafer S vertically in the cylinder 86 without preventing the gas stream 90, a boat 105 shown in FIG. 32 may be used. The boat 105 serving as a base is made of quarts and provided with two rows of pawls 106 via an upright portion. The two rows of pawls 106 hold the longitudinally extending edges of the strip wafer S therebetween to support the strip wafer S in a vertical position. In this configuration, the strip wafer S is accommodated together with the boat 105 in the cylinder 86.

Figure 33:
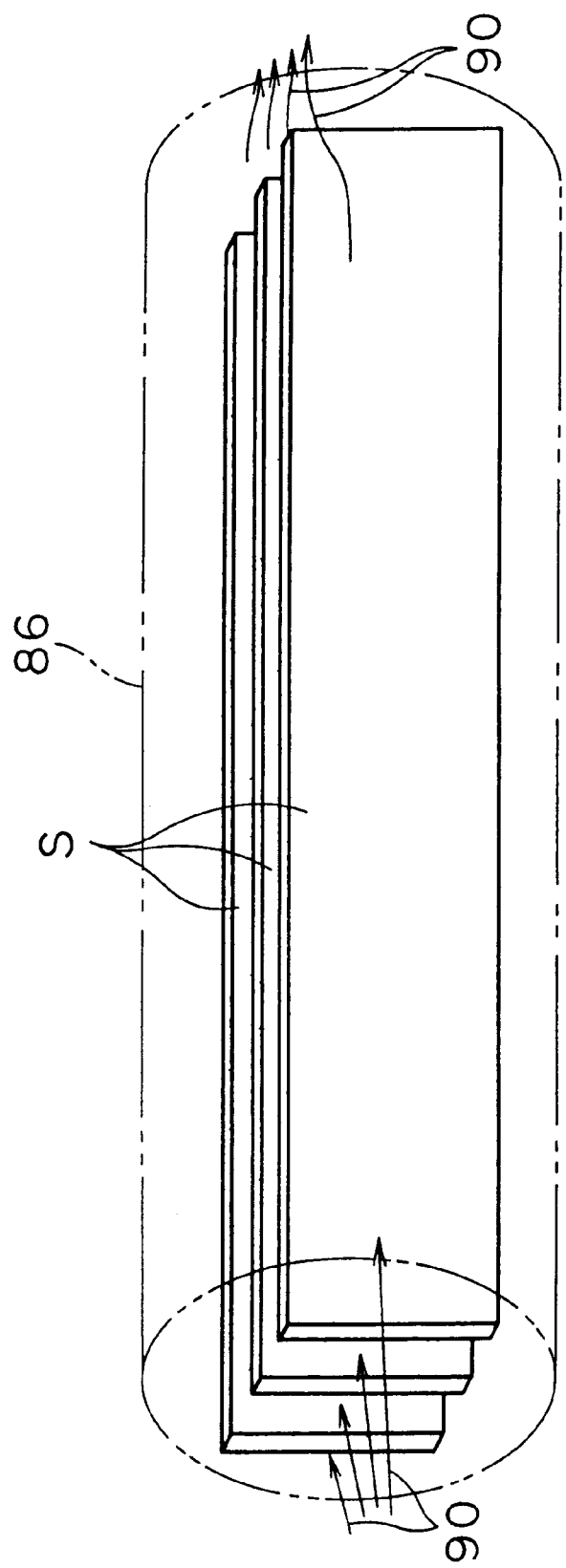
FIG. 33 is a perspective view of still another modification of the apparatus of FIG. 25.

As shown in FIG. 33, the cylinder 86 can also accommodate a plurality of strip wafers S in vertical positions. The plurality of strip wafers S are accommodated in parallel with each other at regular intervals.

Figure 34:
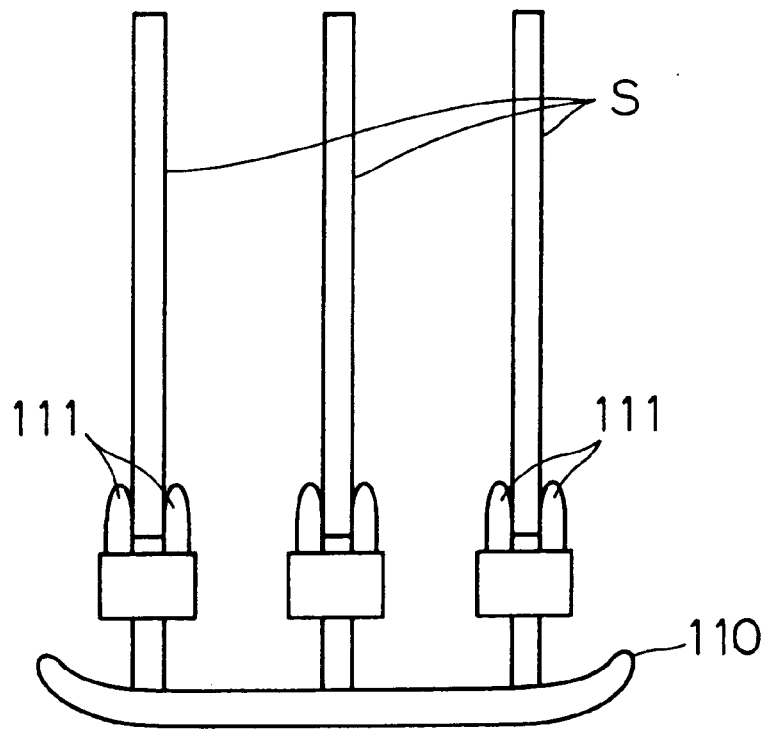
FIG. 34 is a front view showing a member of the apparatus of FIG. 33.

To accommodate the plurality of strip wafers S vertically in the cylinder 86 without preventing the gas stream 90, a boat 110 shown in FIG. 34 may be used. The boat 110 formed as a base is made of quarts with a plurality of parallel upright portions formed thereon in upright positions. On each of the upright portions, two rows of pawls 11 are provided. Respective two rows of pawls 111 hold the longitudinally extending edges of the strip wafers S therebetween to support the plurality of wafers S in vertical positions. In this configuration, the plurality of strip wafers S are accommodated together with the boat 110 in the cylinder 86.

Fifteenth Preferred Embodiment

Figure 35:
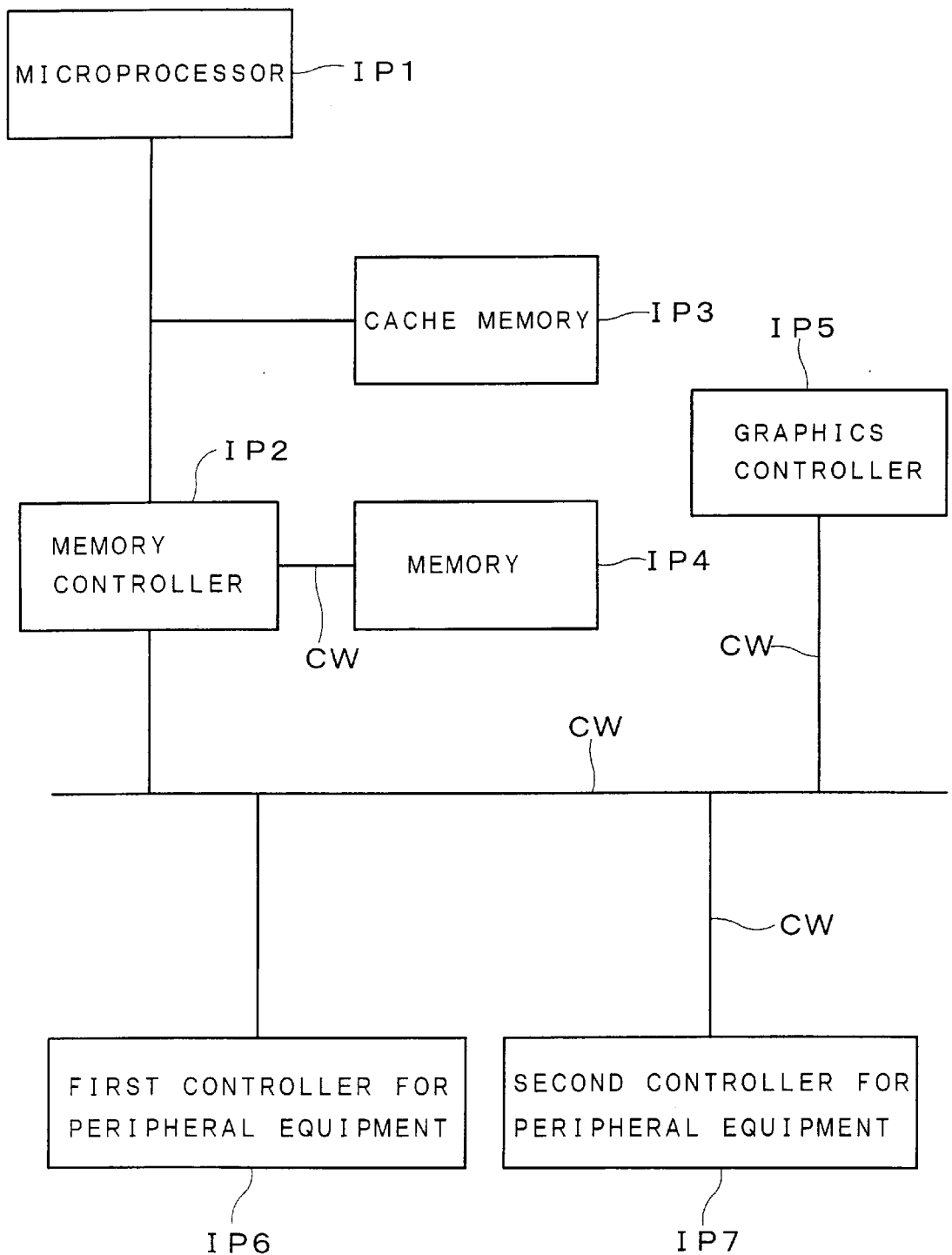
FIG. 35 is a circuit diagram to be processed by an apparatus according to a fifteenth preferred embodiment by way of example.

FIG. 35 is a circuit diagram showing circuitry of a personal computer assumed to be integrated into a single semiconductor chip. In this diagram, circuit elements IP1 through IP7 including a microprocessor and a memory controller are interconnected by connecting wires CW.

Figure 36:
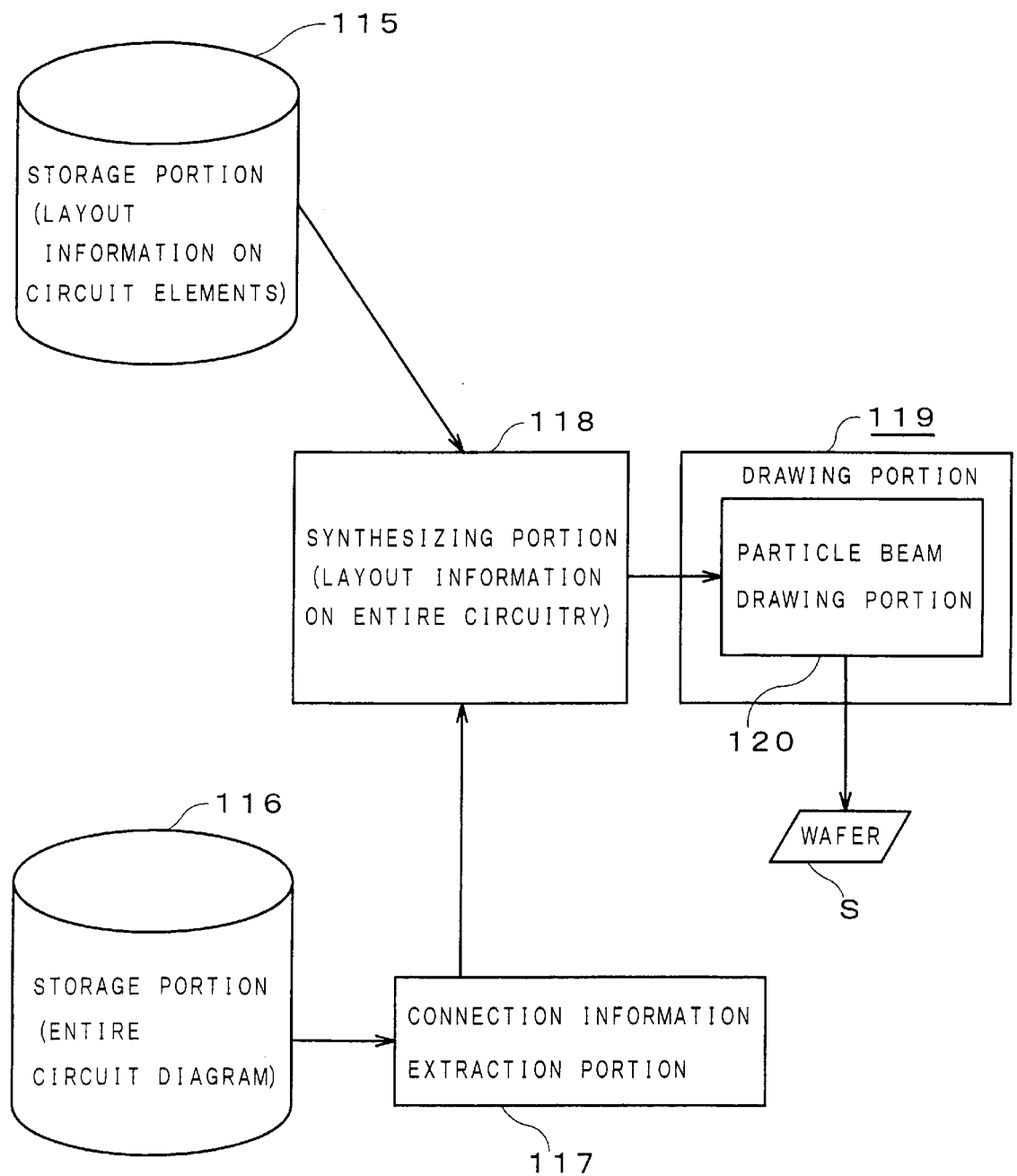
FIG. 36 is a block diagram of the apparatus of the fifteenth preferred embodiment.

FIG. 36 is a block diagram showing a semiconductor manufacturing apparatus according to a fifteenth preferred embodiment. This apparatus is configured as a device to draw (i.e., expose) a layout pattern of circuitry composed of a plurality of IPs as shown in FIG. 35, on a semiconductor wafer. It comprises storage portions 115 and 116, connection information extraction portion 117, a synthesizing portion 118, and a drawing portion 119. The drawing portion 119 comprises a particle beam drawing portion 120.

The storage portion 116 stores circuitry to be integrated into a single semiconductor chip, i.e., an entire circuit diagram showing the entire circuitry. The circuit diagram of FIG. 35 is an example of such an entire circuit diagram. The entire circuit diagram may show a detailed internal configuration of each IP or may show each IP just as a block representing various types of replaceable IPs. For instance, the circuit element IP4, which is a memory, may represent memories having various storage capacities.

The connection information extraction portion 117 extracts connection information from the entire circuit diagram stored in the storage portion 116. The connection information is data representing connecting wires between IPs and between each IP and the external circuit, such as the connecting wires CW of FIG. 35, in a block or circuit diagram level. The storage portion 115 stores data representing layout patterns of various IPs, i.e., layout information on a group of IPs.

The synthesizing portion 118 selectively reads out layout information on each IP described in the entire circuit diagram, from the layout information on the group of IPs stored in the storage portion 115 and further obtains the connection information from the connection information extraction portion 117, thereby to produce data representing a layout pattern of the entire circuitry, i.e., layout information on the entire circuitry. The drawing portion 119 draws the layout pattern of the entire circuitry on the strip wafer S on the basis of the layout information on the entire circuitry produced by the synthesizing portion 118.

Figure 37:
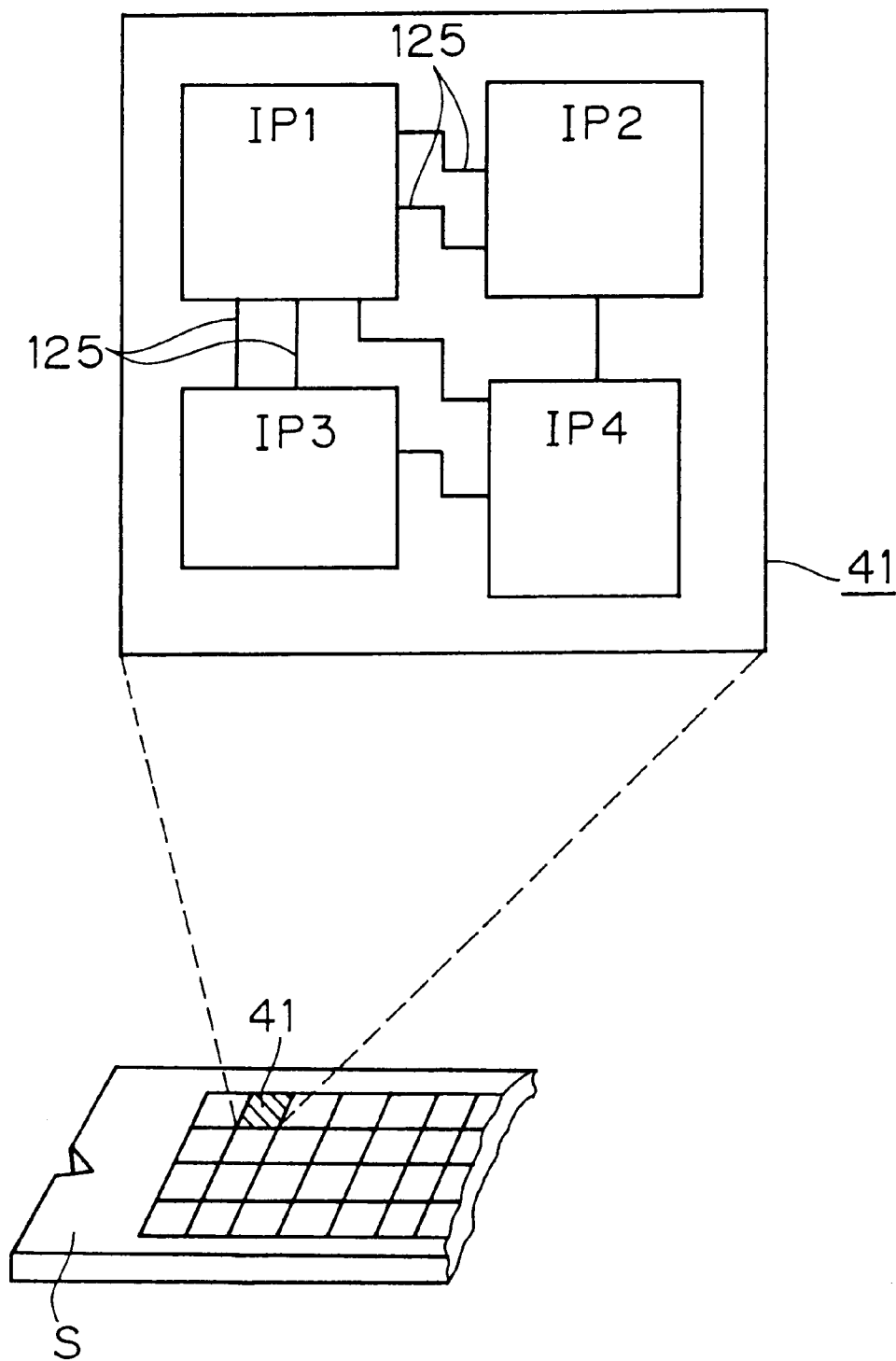
FIG. 37 is an illustration of the operation of the apparatus of FIG. 36.

Since the drawing portion 119 comprises the particle beam drawing portion 120, it can draw without producing a mask pattern. The particle beam drawing portion 120 is, for example, an electron beam exposure system. FIG. 37 illustrates an operation of the drawing by the particle beam drawing portion 120. In this example, the entire circuitry including four IPs and connection wires 125 is integrated into a semiconductor chip 41. The particle beam drawing portion 120 performs the drawing by scanning a particle beam on the strip wafer S so that four semiconductor chips 41 for example are arranged laterally across the strip wafer S.

In this fashion, the use of the semiconductor manufacturing apparatus of the fifteenth preferred embodiment allows effective utilization of existing layout information on various IPs which is semiconductor maker's expertise, whereby a layout pattern of complex entire circuitry composed of those IPs can be drawn. This apparatus is especially suited to be used in combination with IPs whose layout information is written in the hardware description language.

In addition, this apparatus draws the entire circuitry with no mask pattern. This shortens a turnaround time and curtails costs for the flexible manufacturing system. Further, this apparatus can target not only the strip wafer S but also general semiconductor wafers including the circular wafer S0 for drawing. In terms of effective utilization of its characteristics suitable for the flexible manufacturing system, however, the apparatus preferably targets the strip wafer S suitable for the flexible manufacturing system, for drawing.

If the entire circuit diagram stored in the storage portion 116 is so detailed as to define a concrete type of each IP, the synthesizing portion 118 reads out layout information on the IP defined by the entire circuit diagram from the storage portion 115. On the other hand, if the entire circuit diagram stored in the storage portion 116 is only a block diagram, the synthesizing portion 118 reads out layout information on a specific IP which is specified by an operator from a group of replaceable IPs stored in the storage portion 115. The synthesizing portion 118 then produces layout information on the connecting wires according to the selected IP.

Instructions from the operator reflect user's requests for the semiconductor devices. As to the personal computer of FIG. 35, if the user requests a device with a large memory capacity, for example, an IP with a large memory capacity is designated as the circuit element IP4 which is a memory. If the user's request is enhancement of the graphics function, an IP corresponding to a high-performance graphics controller is designated as the circuit element IP5 which is a graphics controller. In this fashion, the types of IPs to be integrated into the semiconductor chips are selectable or variable with flexibility at the user's request or in keeping with the market trends.

As to a semiconductor device which can be configured as an integrated circuit having advanced and various performance by combining a plurality of IPs, there are various well-known devices other than the personal computer shown in FIG. 35. For instance, a workstation, a PDA, a home game machine, a DVD player, a car navigation system, a digital still-video camera, and integrated OA equipment are prime examples, which are described as combinations of various IPs, in "Nikkei Microdevices", September (1995), pp.46–54. Such devices are also suitable for the drawing by the semiconductor manufacturing apparatus according to the fifteenth preferred embodiment.

Sixteenth Preferred Embodiment

Figure 38:
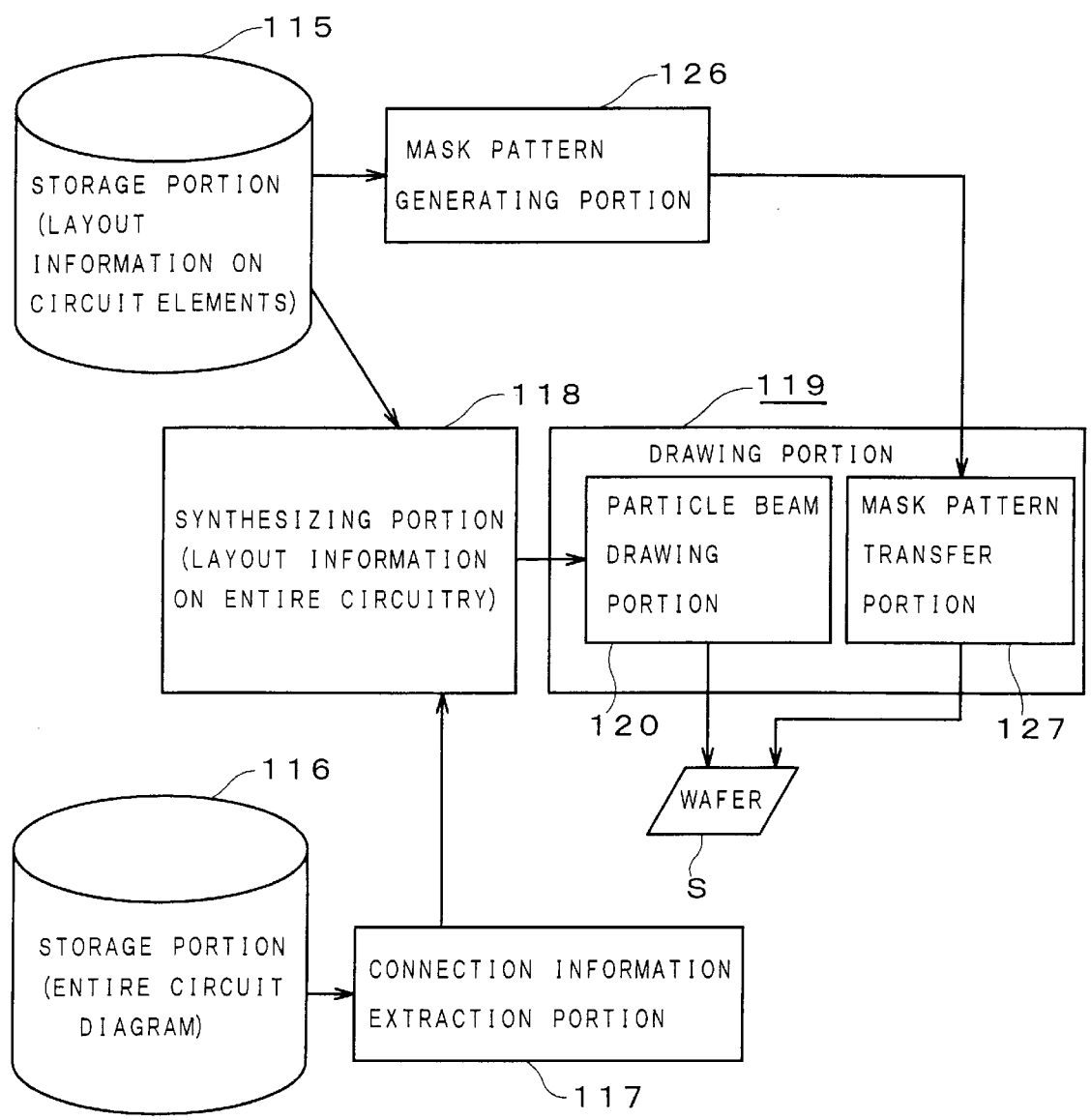
FIG. 38 is a block diagram of an apparatus according to a sixteenth preferred embodiment.

FIG. 38 is a block diagram showing a semiconductor manufacturing apparatus according to a sixteenth preferred embodiment. This apparatus is different from that of the fifteenth preferred embodiment in that drawing (i.e., exposing) using a mask pattern is employed in combination with the drawing (i.e., exposing) using a particle beam. In addition to the components of the fifteenth preferred embodiment, this apparatus further comprises a mask pattern generating portion 126. Further, the drawing portion 119 comprises a mask pattern transfer portion 127 in addition to the particle beam drawing portion 120.

The mask pattern generating portion 126 generates a mask pattern of each IP constituting the entire circuitry. Then, the mask pattern transfer portion 127 transfers the mask pattern generated by the mask pattern generating portion 126 to a predetermined position of the semiconductor chip on the basis of the layout information on the entire circuitry generated by the synthesizing portion 118. The particle beam drawing portion 120 draws the layout patterns of the connecting wires on the basis of the layout information on the entire circuitry.

In this fashion, for the IP whose layout pattern has already been determined, a mask pattern is used. This compensates for low throughput of the particle beam drawing portion 120, thereby improving flexibility in a relatively great volume of production.

Figure 39:
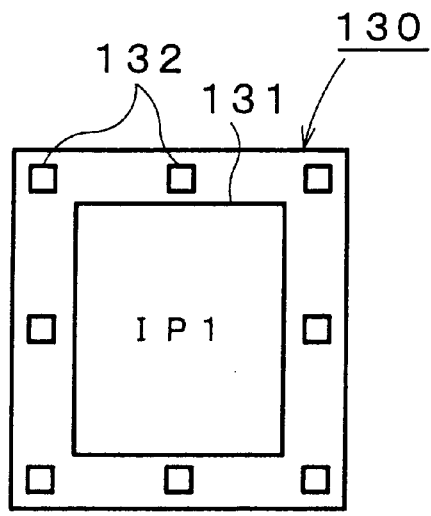
FIGS. 39 and 40 are illustrations of the operation of the apparatus of FIG. 38.

To arrange the mask pattern of each IP orderly in place, as shown in FIG. 39, superposition marks 132 should be patterned around a mask pattern of a circuit element (IP) 131 on a mask 130. And, prior to transferring the mask pattern of the circuit element 131, the particle beam drawing portion 120 should draw another marks indicating where the superposed masks 132 are to be placed, in predetermined portions of the semiconductor chip where the mask pattern is to be transferred.

Figure 40:
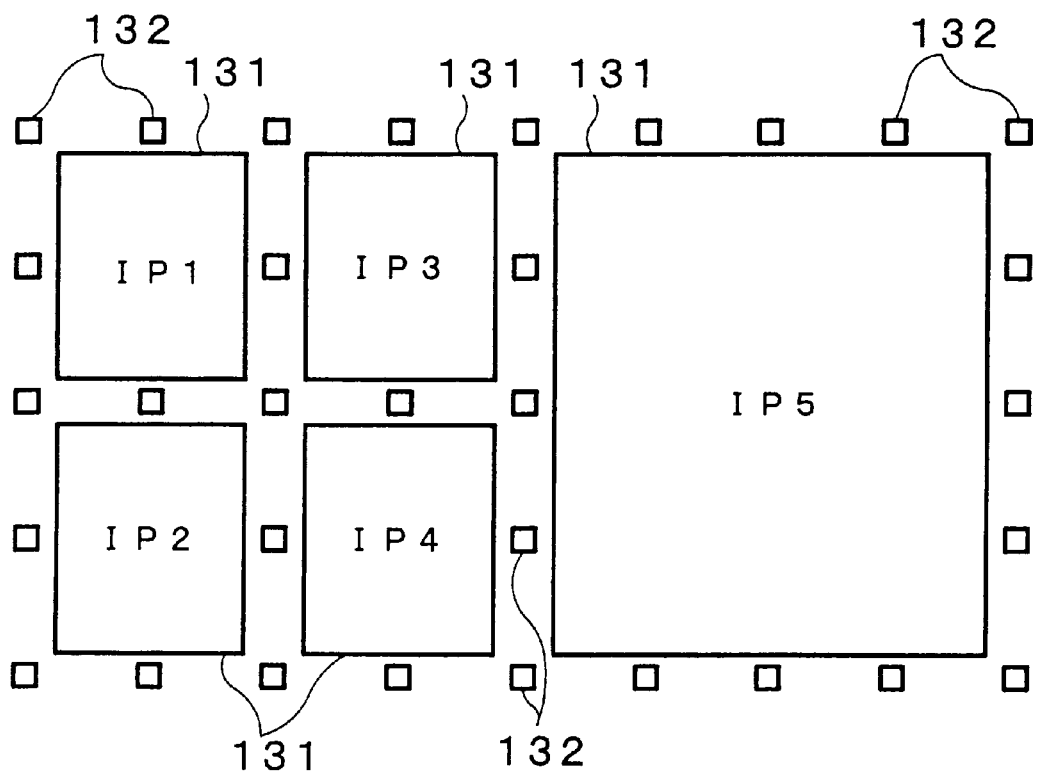
Figure 41:
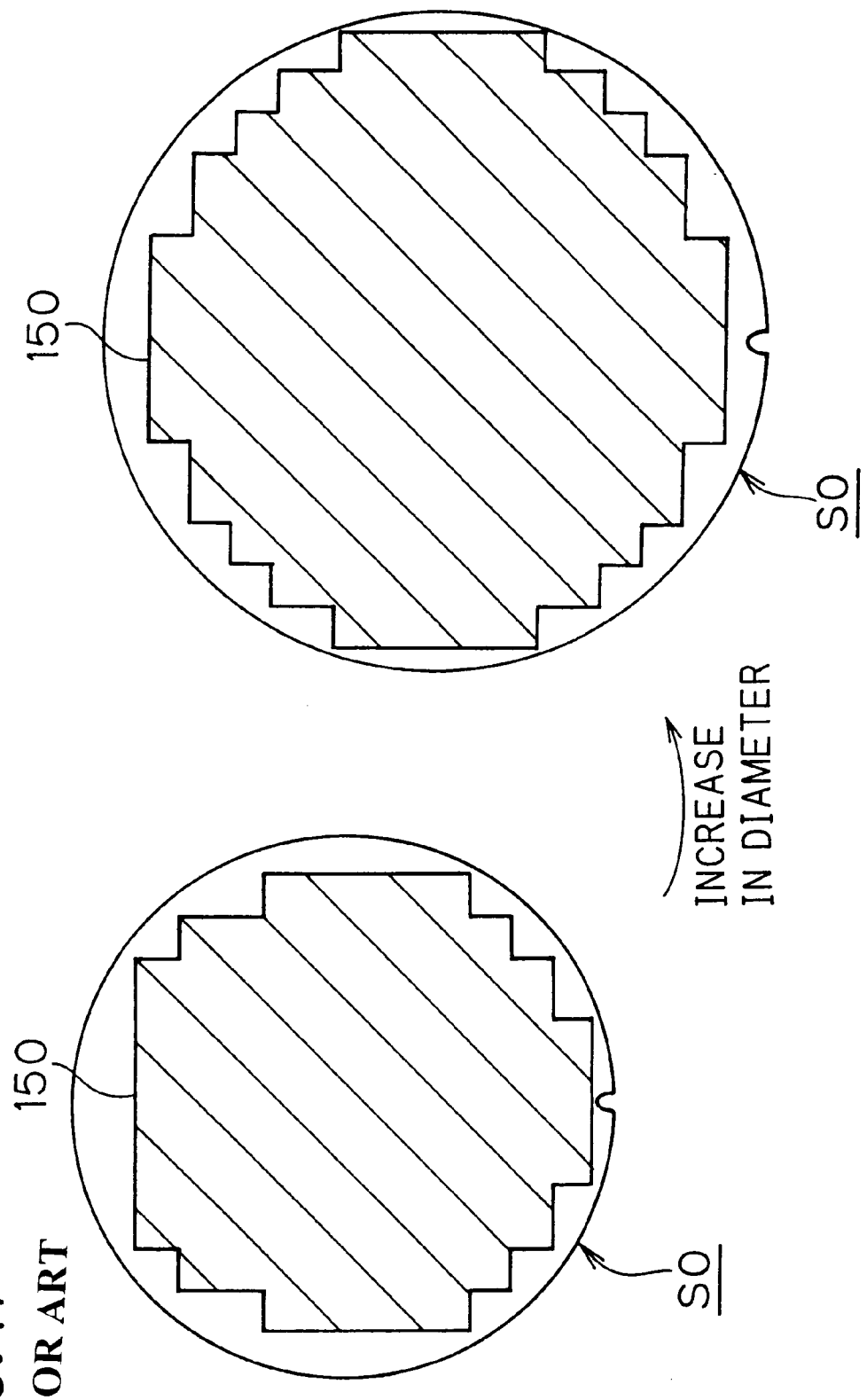
FIG. 41 is a plan view of a conventional semiconductor wafer.
Figure 42:
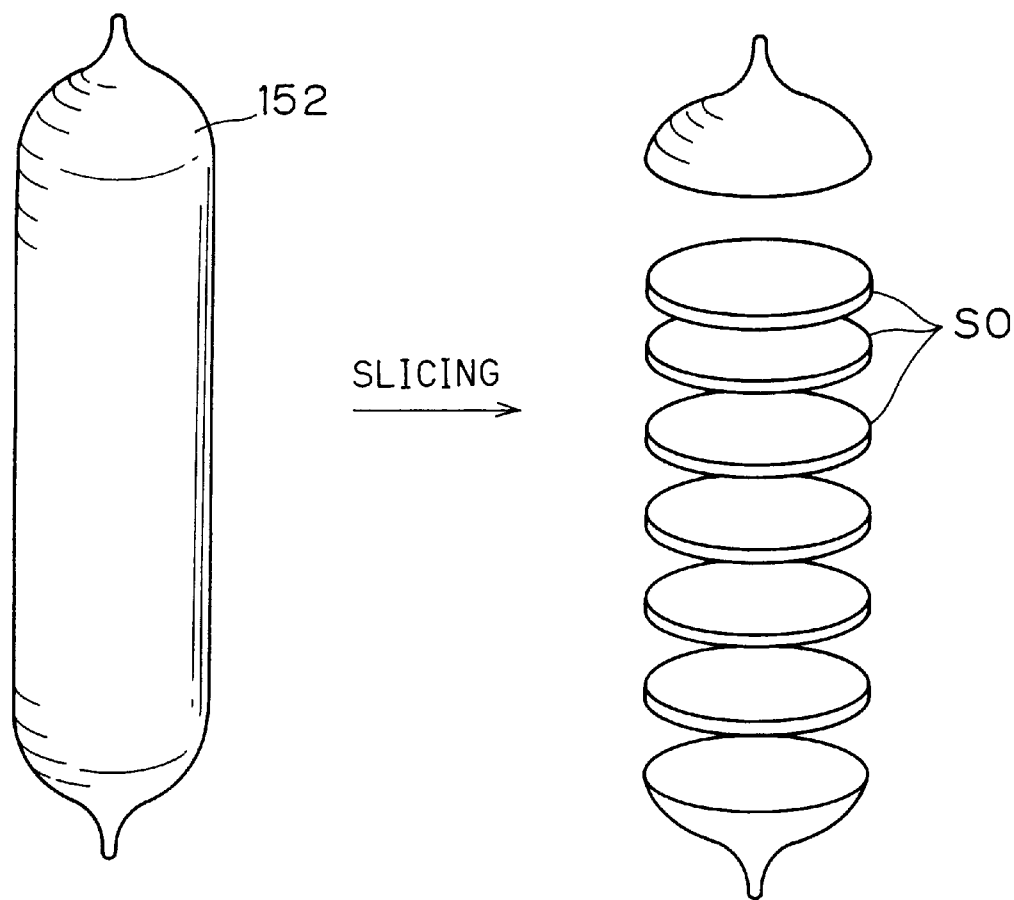
FIG. 42 shows steps of manufacturing the conventional semiconductor wafer.
Figure 43:
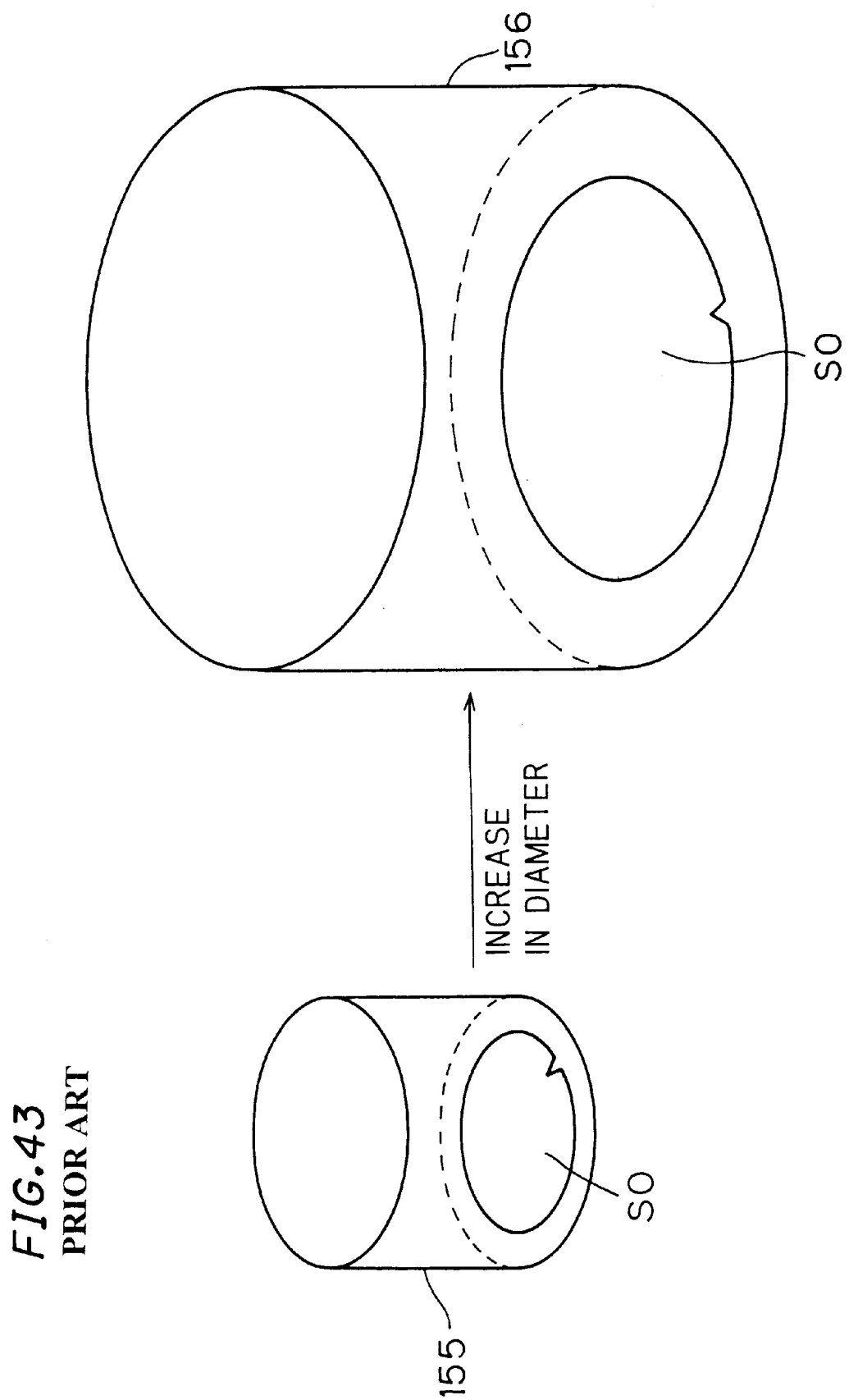
FIG. 43 is a perspective view of a conventional semiconductor manufacturing apparatus.

By superposing the superposition marks 132 accompanied with a plurality of circuit elements 131 on the marks drawn on the semiconductor chips, mask patterns of the plurality of circuit elements 131 are arranged properly in place as shown in FIG. 40. Further, by setting up standardization of the intervals between the superposition marks 132 as exemplarily shown in FIG. 40, the circuit elements 131 of different sizes mixed in the entire circuitry can be easily arranged in the right positions.

Incorporation by Reference

The entire contents of each of the following two references 1 and 2 are incorporated herein by reference:

Ref. 1: "Nikkei Microdevices," December (1998), pp. 88–151; and

Ref. 2: "Nikkei Microdevices," September (1995), pp. 46–54.

While the invention has been described in detail, the foregoing description is in all aspects illustrative and not restrictive. It is understood that numerous other modifications and variations can be devised without departing from the scope of the invention.

What is claimed is:

1. A semiconductor manufacturing apparatus, comprising:
    a carrier portion configured to carry a strip semiconductor substrate having a main surface; and
    a first processing portion configured to create a plurality of discrete regions in a longitudinal direction on said main surface by selectively processing a first discrete area of said main surface and subsequently processing at least a second discrete area of said main surface, wherein said carrier portion carries said main surface of said semiconductor substrate along said longitudinal direction between said selective processing of said discrete areas.

2. The semiconductor manufacturing apparatus according to claim 1, wherein said first processing portion includes:
    a mask stage on which a patterned mask is placed; and
    a lens configured to focus light passing through said mask to create said plurality of discrete regions.

3. The semiconductor manufacturing apparatus according to claim 2, wherein said discrete regions where said lens focuses light extend laterally almost across said main surface of said semiconductor substrate.

4. The semiconductor manufacturing apparatus according to claim 2, wherein said mask placed on said mask stage includes plural kinds of patterns; and
    said mask stage is configured to freely select one of said plural kinds of patterns and pass said light through said selected one.

5. The semiconductor manufacturing apparatus according to claim 2, wherein said mask stage is movable back and forth in a carrying direction of said semiconductor substrate; and
    said lens focuses light passing in a form of slit through said mask on a slit region as each of said discrete regions.

6. A semiconductor device manufactured by the semiconductor manufacturing apparatus according to claim 1.

7. The semiconductor manufacturing apparatus according to claim 1, wherein said first processing portion includes a particle beam exposure system configured to repeatedly scan a particle beam on said main surface to define said plurality of discrete regions.

8. The semiconductor manufacturing apparatus according to claim 1, further comprising a second processing portion configured to further process said discrete regions of said semiconductor substrate.

9. The semiconductor manufacturing apparatus according to claim 8, wherein said second processing portion includes a shower head configured to spray atomized fluid on said discrete regions.

10. The semiconductor manufacturing apparatus according to claim 9, wherein said shower head rotates around an axis parallel to a direction of spraying of said fluid.

11. The semiconductor manufacturing apparatus according to claim 8, wherein said second processing portion includes a heater configured to heat said discrete regions.

12. The semiconductor manufacturing apparatus according to claim 8, wherein said second processing portion includes:
    a polishing head configured to rotate a polishing cloth while pressing it against said discrete regions; and
    a nozzle configured to supply chemical fluid to said discrete regions and respective vicinities of said regions.

13. The semiconductor manufacturing apparatus according to claim 8, further comprising:
    a vacuum vessel defining a vacuum chamber in an inside thereof, wherein said carrier portion is placed in said vacuum chamber, and
    said second processing portion defines a processing chamber opposed to said discrete regions in communication with said vacuum chamber.

14. The semiconductor manufacturing apparatus according to claim 13, wherein said second processing portion includes means for generating plasma in said processing chamber.

15. The semiconductor manufacturing apparatus according to claim 13, wherein said second processing portion includes means for applying gas or particles from said processing chamber to said discrete regions thereby to deposit a film on said discrete regions.

16. The semiconductor manufacturing apparatus according to claim 13, wherein said second processing portion includes means for applying ions from said processing chamber to said discrete regions, thereby to implant said ions into said semiconductor substrate in said discrete regions.

17. The semiconductor manufacturing apparatus according to claim 8, wherein said second processing portion is divided into a plurality of unit processing portions for selectively performing different kinds of processing in different positions on said discrete regions of said main surface of said semiconductor substrate along said longitudinal direction; and said carrier portion carries said semiconductor substrate to pass it through said plurality of unit processing portions in sequence.

18. The semiconductor manufacturing apparatus according to claim 7, wherein said second processing portion includes as said plurality of unit processing portions:

a first unit processing portion including a first shower head configured to spray an atomized etching solution on said discrete regions;

a second unit processing portion including a second shower head configured to spray atomized water on said discrete regions in a different position from said first unit processing portion;

a third unit processing portion including a third shower head configured to spray an atomized organic solvent on said discrete regions in a different position from said first and second unit processing portions; and a fourth unit processing portion including a fan configured to blow air on said discrete regions in a different position from said first through third unit processing portions, and said carrier portion carries said semiconductor substrate to pass it through said first through fourth unit processing portions in this order.

19. A semiconductor manufacturing apparatus comprising:

a support member configured to support a strip semiconductor substrate so that one longitudinally extending edge of said semiconductor substrate is opposed to a horizontal rotation axis;

a rotary driving portion configured to rotatably drive said supporting member around said rotation axis; and a coating fluid dropping portion configured to drop coating fluid on said semiconductor substrate along said edge.

20. A semiconductor manufacturing apparatus comprising:

a cylinder configured to accommodate a strip semiconductor substrate with a longitudinal direction thereof parallel to the central axis of said cylinder;

a heating portion configured to heat said semiconductor substrate which is accommodated in said cylinder; and a gas circulating portion configured to circulate gas from one end to the other in a direction of said central axis in said cylinder.

21. The semiconductor manufacturing apparatus according to claim 20, wherein, said central axis is horizontal, said semiconductor manufacturing apparatus further comprising:

a supporting member for, while supporting said semiconductor substrate vertically, accommodating said semiconductor substrate in said cylinder.

22. The semiconductor manufacturing apparatus according to claim 20, further comprising:

a supporting member for, while supporting a plurality of unit strip semiconductor substrates as said semiconductor substrate in parallel with each other at regular intervals, accommodating them with longitudinal directions thereof parallel to said central axis of said cylinder.

23. A semiconductor manufacturing system comprising:

a strip shaped semiconductor substrate having a main surface;

a carrier portion configured to carry said strip semiconductor substrate; and a first processing portion configured to create a plurality of discrete regions in a longitudinal direction on said main surface by selectively processing a first discrete area of said main surface and subsequently processing at least a second discrete area of said main surface, wherein said carrier portion carries said main surface of said semiconductor substrate along said longitudinal direction between said selective processing of said discrete areas.

24. The semiconductor manufacturing system according to claim 23, wherein said first processing portion includes:

a mask stage on which a patterned mask is placed; and a lens configured to focus light passing through said mask to create said plurality of discrete regions.

25. The semiconductor manufacturing system according to claim 24, wherein said discrete regions where said lens focuses light extend laterally almost across said main surface of said semiconductor substrate.

26. The semiconductor manufacturing system according to claim 24, wherein said mask placed on said mask stage includes plural kinds of patterns; and said mask stage is configured to freely select one of said plural kinds of patterns and pass said light through said selected one.

27. The semiconductor manufacturing system according to claim 24, wherein said mask stage is movable back and forth in a carrying direction of said semiconductor substrate; and said lens focuses light passing in a form of slit through said mask on a slit region as each of said discrete regions.

28. The semiconductor manufacturing system according to claim 23, wherein said first processing portion includes a particle beam exposure system configured to repeatedly scan a particle beam on said main surface to define said plurality of discrete regions.

29. The semiconductor manufacturing system according to claim 23, further comprising a second processing portion configured to further process said discrete regions of said semiconductor substrate.

30. The semiconductor manufacturing system according to claim 29, wherein said second processing portion includes a shower head configured to spray atomized fluid on said discrete regions.

31. The semiconductor manufacturing system according to claim 30, wherein said shower head rotates around an axis parallel to a direction of spraying of said fluid.

32. The semiconductor manufacturing system according to claim 29, wherein
said second processing portion includes a heater configured to heat said discrete regions.

33. The semiconductor manufacturing system according to claim 29, wherein
said second processing portion includes:
a polishing head configured to rotate a polishing cloth while pressing it against said discrete regions; and
a nozzle configured to supply chemical fluid to said discrete regions and respective vicinities of said regions.

34. The semiconductor manufacturing system according to claim 29, further comprising:
a vacuum vessel defining a vacuum chamber in an inside thereof, wherein said carrier portion is placed in said vacuum chamber, and
said second processing portion defines a processing chamber opposed to said discrete regions in communication with said vacuum chamber.

35. The semiconductor manufacturing system according to claim 34, wherein
said second processing portion includes means for generating plasma in said processing chamber.

36. The semiconductor manufacturing apparatus according to claim 34, wherein
said second processing portion includes means for applying gas or particles from said processing chamber to said discrete regions thereby to deposit a film on said discrete regions.

37. The semiconductor manufacturing apparatus according to claim 34, wherein
said second processing portion includes means for applying ions from said processing chamber to said discrete regions, thereby to implant said ions into said semiconductor substrate in said discrete regions.

38. The semiconductor manufacturing apparatus according to claim 29, wherein
said second processing portion is divided into a plurality of unit processing portions for selectively performing different kinds of processing in different positions on said discrete regions of said main surface of said semiconductor substrate along said longitudinal direction; and
said carrier portion carries said semiconductor substrate to pass it through said plurality of unit processing portions in sequence.

39. The semiconductor manufacturing apparatus according to claim 38, wherein
said second processing portion includes as said plurality of unit processing portions:
a first unit processing portion including a first shower head configured to spray an atomized etching solution on said discrete regions;
second unit processing portion including a second shower head configured to spray atomized water on said discrete regions in a different position from said first unit processing portion;
a third unit processing portion including a third shower head configured to spray an atomized organic solvent on said discrete regions in a different position from said first and second unit processing portions; and
a fourth unit processing portion including a fan configured to blow air on said partial regions in a different position from said first through third unit processing portions, and
said carrier portion carries said semiconductor substrate to pass it through said first through fourth unit processing portions in this order.

* * * * *